(12) United States Patent
Sung

(10) Patent No.: US 11,710,804 B2
(45) Date of Patent: Jul. 25, 2023

(54) ELECTRODE ASSEMBLY HAVING LOWER ELECTRODE DIRECTLY ON THE SURFACE OF A BASE SUBSTRATE, A FIRST ELECTRODE ON THE LOWER ELECTRODE, AND THE SECOND ELECTRODE FORMED ON AND SPACED APART FROM THE FIRST ELECTRODE

(71) Applicant: SAMSUNG DISPLAY CO., LTD., Yongin-si (KR)

(72) Inventor: Yeon Goog Sung, Gyeonggi-do (KR)

(73) Assignee: Samsung Display Co., Ltd., Yongin-si (KR)

( * ) Notice: Subject to any disclaimer, the term of this patent is extended or adjusted under 35 U.S.C. 154(b) by 97 days.

(21) Appl. No.: 17/216,631

(22) Filed: Mar. 29, 2021

(65) Prior Publication Data

US 2021/0234067 A1    Jul. 29, 2021

Related U.S. Application Data

(63) Continuation of application No. 15/528,035, filed as application No. PCT/KR2015/012250 on Nov. 13, 2015, now Pat. No. 10,964,842.

(30) Foreign Application Priority Data

Nov. 18, 2014    (KR) ........................ 10-2014-0161065

(51) Int. Cl.
*H01L 33/08*    (2010.01)
*B82B 3/00*    (2006.01)
(Continued)

(52) U.S. Cl.
CPC ............ *H01L 33/08* (2013.01); *B82B 3/0066* (2013.01); *H01L 33/007* (2013.01); *H01L 33/06* (2013.01);
(Continued)

(58) Field of Classification Search
CPC ... H01L 25/0753; H01L 33/08; H01L 33/007; H01L 33/06; H01L 33/24; H01L 33/32;
(Continued)

(56) References Cited

U.S. PATENT DOCUMENTS 7,727,788 B2    6/2010    Han et al.
7,825,328 B2    11/2010    Li
(Continued)

FOREIGN PATENT DOCUMENTS

CN    102326258 A    1/2012
CN    103608937 B    3/2017
(Continued)

OTHER PUBLICATIONS

International Search Report for corresponding International Application No. PCT/KR2014/006122, dated Aug. 25, 2014, 2 pages.
(Continued)

*Primary Examiner* — Ermias T Woldegeorgis
(74) *Attorney, Agent, or Firm* — Lewis Roca Rothgerber Christie LLP

(57) ABSTRACT

The present invention relates to an electrode assembly comprising nano-scale-LED elements and a method for manufacturing the same and, more specifically, to an electrode assembly comprising nano-scale-LED elements and a method for manufacturing the same, in which the number of nano-scale-LED elements included in a unit area of the electrode assembly is increased, the light extraction efficiency of individual nano-scale-LED elements is increased so as to maximize light intensity per unit area, and at the same time, nano-scale-LED elements on a nanoscale are connected to an electrode without a fault such as an electrical short circuit.

15 Claims, 10 Drawing Sheets

(51) Int. Cl.
  *H01L 33/00* (2010.01)
  *H01L 33/06* (2010.01)
  *H01L 33/24* (2010.01)
  *H01L 33/32* (2010.01)
  *H01L 33/38* (2010.01)
  *H01L 33/44* (2010.01)

(52) U.S. Cl.
  CPC .............. *H01L 33/24* (2013.01); *H01L 33/32* (2013.01); *H01L 33/387* (2013.01); *H01L 33/44* (2013.01); *H01L 2933/0016* (2013.01)

(58) Field of Classification Search
  CPC ................... H01L 33/387; H01L 33/44; H01L 2933/0016; H01L 33/36; H01L 33/38; B82B 3/0066
  See application file for complete search history.

(56) References Cited

U.S. PATENT DOCUMENTS

| | | | |
|---|---|---|---|
| 8,129,710 | B2 | 3/2012 | Cho et al. |
| 8,330,173 | B2 | 12/2012 | Kim |
| 8,357,960 | B1 | 1/2013 | Dutta |
| 8,378,349 | B2 | 2/2013 | Ko et al. |
| 8,871,544 | B2 | 10/2014 | Jeong et al. |
| 9,059,114 | B2 | 6/2015 | Do et al. |
| 9,112,112 | B2 | 8/2015 | Do et al. |
| 9,570,425 | B2 | 2/2017 | Do |
| 9,773,761 | B2 | 9/2017 | Do |
| 9,978,725 | B2 | 5/2018 | Do |
| 10,276,630 | B2 | 4/2019 | Lee et al. |
| 10,910,512 | B2 | 2/2021 | Sung |
| 2003/0141507 | A1 | 7/2003 | Krames et al. |
| 2006/0023451 | A1 | 2/2006 | Han et al. |
| 2007/0042520 | A1 | 2/2007 | Oh et al. |
| 2009/0137075 | A1 | 5/2009 | Yang et al. |
| 2009/0267049 | A1* | 10/2009 | Cho ............... H01L 33/18 257/13 |
| 2009/0303713 | A1 | 12/2009 | Chang et al. |
| 2011/0033976 | A1 | 2/2011 | Di Cioccio et al. |
| 2011/0240959 | A1 | 10/2011 | Konsek et al. |
| 2011/0254043 | A1* | 10/2011 | Negishi ............... H01L 33/20 257/99 |
| 2011/0272014 | A1 | 11/2011 | Mathai et al. |
| 2011/0309382 | A1 | 12/2011 | Löwgren |
| 2012/0181546 | A1 | 7/2012 | Tu |
| 2012/0248408 | A1 | 10/2012 | Paek et al. |
| 2013/0027623 | A1 | 1/2013 | Negishi et al. |
| 2013/0221385 | A1* | 8/2013 | Shibata ............... H01L 31/052 257/88 |
| 2014/0034120 | A1 | 2/2014 | Wang et al. |
| 2014/0124801 | A1 | 5/2014 | Lee |
| 2014/0206116 | A1 | 7/2014 | Hwang et al. |
| 2014/0209858 | A1 | 7/2014 | Cha et al. |
| 2014/0209942 | A1 | 7/2014 | Dingemans et al. |
| 2015/0062484 | A1 | 3/2015 | Lee et al. |
| 2016/0049553 | A1 | 2/2016 | Sim et al. |
| 2016/0172339 | A1 | 6/2016 | Do |
| 2017/0062684 | A1 | 3/2017 | Ikeda et al. |
| 2017/0317228 | A1 | 11/2017 | Sung |
| 2018/0287010 | A1 | 10/2018 | Sung |

FOREIGN PATENT DOCUMENTS

| | | | | |
|---|---|---|---|---|
| JP | 2011-91257 | A | 5/2011 | |
| JP | 2011-205106 | A | 10/2011 | |
| JP | 2015-76585 | A | 4/2015 | |
| KR | 10-2008-0021023 | A | 3/2008 | |
| KR | 10-2009-0020869 | A | 2/2009 | |
| KR | 10-0903280 | B1 | 6/2009 | |
| KR | 10-2009-0121743 | A | 11/2009 | |
| KR | 10-2010-0066768 | A | 6/2010 | |
| KR | 10-2010-0091269 | A | 8/2010 | |
| KR | 10-2012-0022649 | A | 3/2012 | |
| KR | 10-2012-0120377 | | 11/2012 | |
| KR | 10-2012-0122159 | A | 11/2012 | |
| KR | 20120120377 | A * | 11/2012 | ......... H01L 25/0753 |
| KR | 20120122645 | A | 11/2012 | |
| KR | 10-1209449 | B1 | 12/2012 | |
| KR | 10-1429095 | B1 | 8/2014 | |
| KR | 10-1436123 | B1 | 11/2014 | |
| KR | 10-2015-0006798 | A | 1/2015 | |
| WO | WO 2012148231 | A2 | 11/2012 | |
| WO | WO 2016/080712 | A1 | 5/2016 | |

OTHER PUBLICATIONS

Office Action issued in U.S. Appl. No. 15/528,046 by the USPTO, dated Aug. 10, 2018, 9 pages.
Office Action issued in U.S. Appl. No. 16/070,184 by the USPTO, dated Aug. 29, 2019, 9 pages.
Office Action issued in U.S. Appl. No. 15/528,046 by the USPTO, dated Sep. 12, 2019, 8 pages.
Office Action issued in U.S. Appl. No. 16/070,184 by the USPTO, dated May 12, 2020, 8 pages.
Office action from USPTO for U.S. Appl. No. 15/528,035, dated Sep. 10, 2018, 11 pages.
Office action from USPTO for U.S. Appl. No. 15/528,035, dated Mar. 15, 2019, 14 pages.
Office action from USPTO for U.S. Appl. No. 15/528,035, dated Sep. 5, 2019, 15 pages.
Office action from USPTO for U.S. Appl. No. 15/528,035, dated Mar. 13, 2020, 17 pages.
Office action from USPTO for U.S. Appl. No. 15/528,035, dated Aug. 18, 2020, 19 pages.
Notice of Allowance from USPTO for U.S. Appl. No. 15/528,035, dated Nov. 25, 2020, 8 pages.
Chinese Office action for Application No. 201910853132.1, dated Mar. 25, 2022, 6 pages.
Office action from USPTO for U.S. Appl. No. 17/164,763, dated Apr. 6, 2022, 14 pages.
U.S. Notice of Allowance dated Mar. 29, 2023, issued in U.S. Appl. No. 17/164,763 (7 pages).

* cited by examiner

ELECTRODE ASSEMBLY HAVING LOWER ELECTRODE DIRECTLY ON THE SURFACE OF A BASE SUBSTRATE, A FIRST ELECTRODE ON THE LOWER ELECTRODE, AND THE SECOND ELECTRODE FORMED ON AND SPACED APART FROM THE FIRST ELECTRODE

CROSS-REFERENCE TO RELATED APPLICATIONS

This application is a continuation of U.S. patent application Ser. No. 15/528,035, filed May 18, 2017, which is a national phase application under 35 U.S.C. § 371 of International Application No. PCT/KR2015/012250, filed Nov. 13, 2015, which claims priority to Korean Patent Application No. 10-2014-0161065, filed Nov. 18, 2014, the entire content of all of which is incorporated herein by reference.

TECHNICAL FIELD

The present disclosure relates to an electrode assembly including nano-scale-light emitting diode (LED) elements and a method for manufacturing the same, and more particularly, to an electrode assembly including nano-scale-LED elements and a method for manufacturing the same, which are capable of maximizing light intensity of the electrode assembly per unit area by increasing the number of nano-scale-LED elements included in a unit area of the electrode assembly and light extraction efficiency of each of the nano-scale-LED elements, and, at the same time, are capable of connecting the nano-scale-LED elements fabricated at a nanoscale size to an electrode without faults such as an electrical short circuit and the like.

BACKGROUND ART

In 1992, Nakamura et al. of Nichia Corporation in Japan succeeded in fusing a high-quality single crystal GaN nitride semiconductor by applying a low-temperature GaN compound buffer layer thereto, and development of a light emitting diode (LED) has been actively performed. An LED is a semiconductor having a structure in which an n-type semiconductor crystal in which a plurality of carriers are electrons and a p-type semiconductor crystal in which a plurality of carriers are holes have a junction using a characteristic of a compound semiconductor, and is a semiconductor element that converts an electrical signal into light having a desired wavelength band and then emits the light. With regards to such an LED, a method of manufacturing an LED and an LED manufactured by the same are disclosed in Korean Patent Application Publication No. 2009-0121743.

Such an LED semiconductor is known as a revolution of light as a green material since light conversion efficiency of the LED semiconductor is high, energy consumption thereof is very low, a lifetime thereof is semi-permanent, and the LED semiconductor is environmentally friendly. Recently, high brightness red, orange, green, blue, and white LEDs have been developed owing to the development of compound semiconductor technology, and the LEDs are currently applied in various fields such as traffic lights, a mobile phone, automobile headlights, an outdoor display board, and a liquid crystal display (LCD) back light unit (BLU), and research is now being actively performed domestically and abroad. Specifically, since a GaN-based compound semiconductor having a wide band gap is a material that is used to manufacture an LED semiconductor element which emits green light, blue light, and ultraviolet light, and a white LED element may be fabricated using a blue LED element, studies is being performed with respect to the fabrication of a white LED element.

Among the studies, research has been actively performed using a nano-scale-LED element that is fabricated with a nano- or nano-scale-sized LED, and research for utilizing such a nano-scale-LED element as lighting and a display are underway. In such research, attention has been continuously focused on an electrode capable of applying power to a nano-scale-LED element, an electrode disposition for an application purpose and reducing a space occupied by the electrode, a method for mounting a nano-scale-LED on a disposed electrode, and the like.

Among the above areas of focus, there is still difficulty in the method for mounting a nano-scale-LED element on a disposed electrode, in which it is difficult for the nano-scale-LED element to be disposed and mounted as intended on the disposed electrode according to a limitation in size of the nano-scale-LED element. This is because the nano-scale-LED element is fabricated at a nanoscale or nano-scalescale size, and thus cannot be disposed and mounted on a target electrode region with a human hand. In addition, although the nano-scale-LED element is mounted on the target electrode region, it is very difficult to adjust the number of nano-scale-LED elements included in a unit electrode region, a positional relationship between the nano-scale-LED element and the electrode, and the like to match intentions, and the number of LED elements included in a unit area is limited when the nano-scale-LED element is disposed on a two-dimensional plane such that it is difficult to obtain excellent light intensity. Further, since all nano-scale-LED elements connected to two different electrodes are not able to emit light without faults such as an electrical short circuit and the like, there is a problem in that target light intensity is more difficult to obtain.

SUMMARY OF THE INVENTION

To address the above described problem, an objective of the present disclosure is to provide an electrode assembly including nano-scale light emitting diode (LED) elements and a method for manufacturing the same, which are capable of maximizing light intensity per unit area by increasing the number of nano-scale-LED elements included in a unit area of the electrode assembly and light extraction efficiency of each of the nano-scale-LED elements, and, at the same time, are capable of connecting the nano-scale-LED elements fabricated in a nanoscale size to an electrode without faults such as an electrical short circuit and the like.

To address the above described problem, the present disclosure provides an electrode assembly including a base substrate; a first electrode formed on the base substrate to have a first lateral surface; a second electrode formed on the base substrate to have a second lateral surface that is disposed to face the first lateral surface of the first electrode, and a plurality of nano-scale light emitting diode (LED) elements having one end thereof configured to come into contact with the first lateral surface and the other end thereof configured to come into contact with the second lateral surface, and interposed between the first electrode and the second electrode.

In accordance with one preferred embodiment of the present disclosure, a height of each of the first lateral surface and the second lateral surface may range from 1.1 to 10 times a diameter of each of the plurality of nano-scale-LED elements.

In accordance with another one preferred embodiment of the present disclosure, the plurality of nano-scale-LED elements may form a multilayer based on the base substrate.

In accordance with still another one preferred embodiment of the present disclosure, the first lateral surface of the first electrode and the second lateral surface of the second electrode may be parallel to each other.

In accordance with another one preferred embodiment of the present disclosure, the plurality of nano-scale-LED elements may be connected to the first lateral surface and the second lateral surface to be perpendicular thereto in a length direction of each of the plurality of nano-scale-LED elements.

In accordance with still another one preferred embodiment of the present disclosure, each of the plurality of nano-scale-LED elements may include a first conductive semiconductor layer; an active layer formed on the first conductive semiconductor layer; a second conductive semiconductor layer formed on the active layer; and an insulating film configured to entirely cover at least an outer surface of the active layer among outer surfaces of each of the plurality of nano-scale-LED elements.

In accordance with another one preferred embodiment of the present disclosure, both ends of each of the plurality of nano-scale-LED elements may include a convex curved surface.

In accordance with still another one preferred embodiment of the present disclosure, a length of each of the plurality of nano-scale-LED elements may range from 100 nm to 10 μm.

In accordance with still another one preferred embodiment of the present disclosure, each of the first electrode and the second electrode may include a portion in which a width of each of the first electrode and the second electrode narrows toward an upward direction that is perpendicular to the base substrate.

Also, to address the above described problem, the present disclosure provides an electrode assembly including a plurality of nano-scale-LED elements disposed in a separation space between a first electrode and a second electrode which have lateral surfaces facing each other, and configured to enable one end of each of the plurality of nano-scale-LED elements to come into contact with the lateral surface of the first electrode and the other end thereof to come into contact with the lateral surface of the second electrode, wherein $1 \times 10^3$ to $1 \times 10^{12}/mm^3$ of the plurality of nano-scale-LED elements are included in the electrode assembly.

Also, to address the above described problem, the present disclosure provides a method for manufacturing an electrode assembly, which includes (1) forming a first electrode on a base substrate, forming a second electrode on the base substrate to be spaced apart from the first electrode, and disposing a first lateral surface of the first electrode to face a second lateral surface of the second electrode; (2) introducing a plurality of nano-scale-LED elements and a solvent to a separation space between the first electrode and the second electrode; and (3) applying electrical power to the first electrode and the second electrode to self-align the plurality of nano-scale-LED elements so that one end of each of the plurality of nano-scale-LED elements comes into contact with the first lateral surface of the first electrode and the other end thereof comes into contact with the second lateral surface of the second electrode.

In accordance with one preferred embodiment of the present disclosure, each of the first electrode and the second electrode may include a portion in which a width of each of the first electrode and the second electrode narrows toward the upward direction that is perpendicular to the base substrate.

In accordance with another one preferred embodiment of the present disclosure, each of the plurality of nano-scale-LED elements may include a first conductive semiconductor layer; an active layer formed on the first conductive semiconductor layer; a second conductive semiconductor layer formed on the active layer; and an insulating film configured to entirely cover at least an outer surface of the active layer among outer surfaces of each of the plurality of nano-scale-LED elements.

In accordance with still another one preferred embodiment of the present disclosure, both ends of each of the plurality of nano-scale-LED elements may include a convex curved surface.

In accordance with another one preferred embodiment of the present disclosure, a voltage of the electrical power applied to the first electrode and the second electrode for 10 to 120 seconds may be in a range of 10 to 500 Vpp.

Terms used herein will be defined below.

In the description of embodiments of the present disclosure, a "separation space" is a region into which a nano-scale-LED element may be inserted between two different adjacent electrodes, and is referred to as being a space comparted by lateral surfaces, which face each other, of two different adjacent electrodes, an imaginary bottom surface connecting bottom surfaces of the two adjacent electrodes, and an imaginary top surface covering the lateral surfaces, which face each other, of the two different adjacent electrodes.

In the description of the embodiments the present disclosure, when each layer, region, pattern, or structure is referred to as being "on," "over," "above," "under," "below," and "lower than" a substrate, it should be construed that the adverbs "directly" and "indirectly" are included in the terms "on," "over," "above," "under," "below," and "lower than."

In the description of the embodiments the present disclosure, a "first electrode" and a "second electrode" may include both an electrode region on which a nano-scale-LED element may be substantially mounted or an electrode region that may be further included according to a method for disposing an electrode on a base substrate.

In the description of embodiments the present disclosure, the term "interposed" refers to a nano-scale-LED element being inserted between different electrodes to be connected to the different electrodes by enabling one end of the nano-scale-LED element to come into contact with one lateral surface of one electrode and the other end thereof to come into contact with another lateral surface of the other electrode in a space between lateral surfaces, which face each other, of the two different electrodes (for example, a first electrode and a second electrode). Also, being "electrically coupled" refers to a state in which a nano-scale-LED element is inserted between two different electrodes and connected to the two different electrodes, and, at the same time, when electrical power is applied to an electrode line, the nano-scale-LED element emits light.

In the description of the embodiments the present disclosure, "the same," "parallel," or "perpendicular" is referring not to the limited physically accurate "the same," "parallel," or "perpendicular," and includes the extent of substantially "the same," "parallel," or "perpendicular."

In the description of the embodiments the present disclosure, a "multilayer" refers to a single or a plurality of nano-scale-LED elements forming a single layer with respect to an upward direction that is perpendicular to a base substrate, and a shape of the layer being formed, wherein the layer may be a surface that is parallel to or inclined from the base substrate, but does not refer to a surface perpendicular to the base substrate.

The electrode assembly of the present disclosure is configured such that a nano-scale light emitting diode (LED) element is three-dimensionally disposed in a space between electrodes so that the number of nano-scale-LED elements included in an electrode line per unit area can be increased, and, at the same time, light extraction efficiency of each of the nano-scale-LED elements can be improved, thereby maximizing light intensity of the electrode assembly per unit area. Also, a space occupied by a single nano-scale-LED element in the electrode assembly can be minimized so that a space in which other nano-scale-LED elements are able to be disposed can be relatively increased such that the number of nano-scale-LED elements included in the electrode assembly can be increased, and thus light intensity can be more increased. Further, a nanoscale nano-scale-LED element is connected to an electrode without faults such as an electrical short circuit and the like so that a defect rate of the electrode assembly can be decreased. Moreover, even though a nano-scale-LED element does not have a specific structural shape to prevent faults such as an electrical short circuit and the like, a detect rate of a nano-scale-LED electrode assembly can be minimized.

DETAILED DESCRIPTION OF THE INVENTION

Hereinafter, one preferred embodiment of the present disclosure will be described in more detail with reference to the accompanying drawings.

Figure 1:
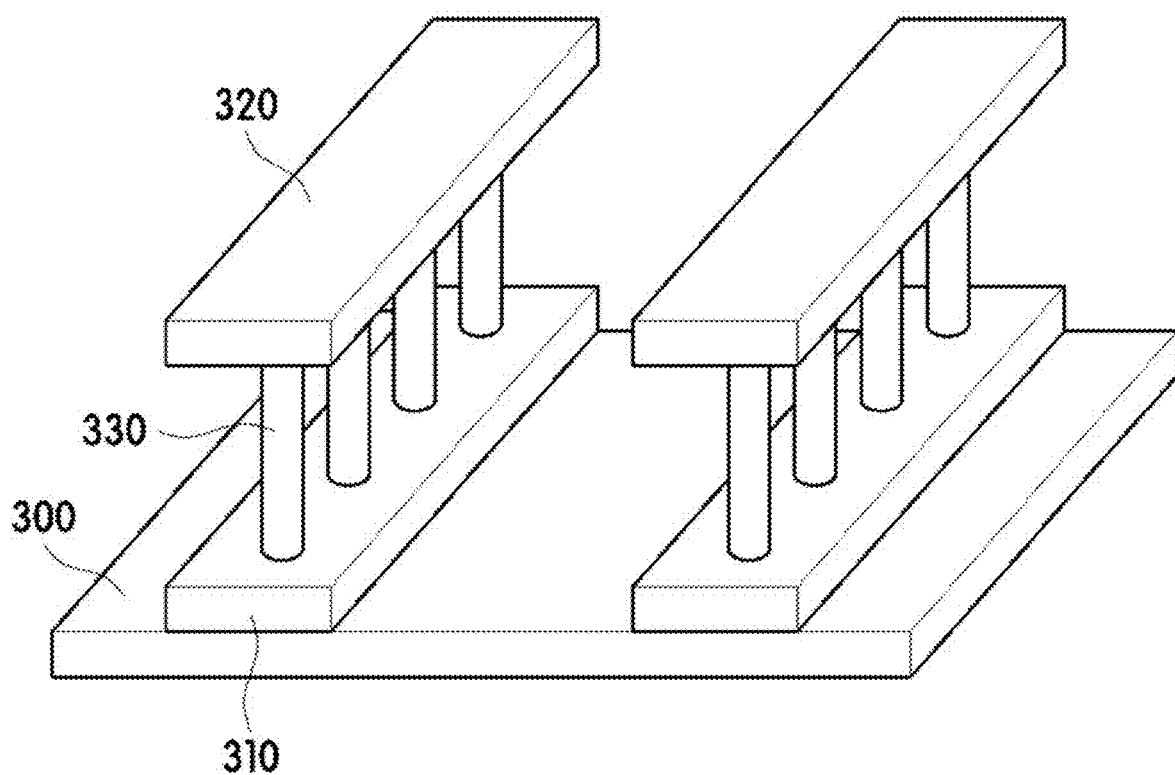
FIG. 1 is a perspective view of a typical electrode assembly including a nano-scale light emitting diode (LED) element.

As is described above, since a nano-scale light emitting diode (LED) element is not disposed and mounted on a target electrode region with a human hand due to a limitation in size of the nano-scale-LED element according to a related art, there is a problem in that it is very difficult for the nano-scale-LED element to be disposed and mounted as intended on an electrode. FIG. 1 is a perspective view of a typical electrode assembly including a nano-scale-LED element, and illustrates a first electrode 310 formed over a base substrate 300, a second electrode 320 formed on the first electrode 310 to be separated therefrom and in parallel therewith, and a nano-scale-LED element 330 connected between the first electrode 310 and the second electrode 320 in a three-dimensionally upright form. In the case of an electrode assembly having such a structure, there is a problem in that it is difficult for each of LED elements that are separately fabricated to be erected over one electrode in a three-dimensionally upright form. Also, growing a nano-scale-LED element on the first electrode 310 causes a problem in that a manufacturing process is very complicated, and there is a further problem in that a large area electrode assembly cannot be manufactured through such a manufacturing process.

Figure 2:
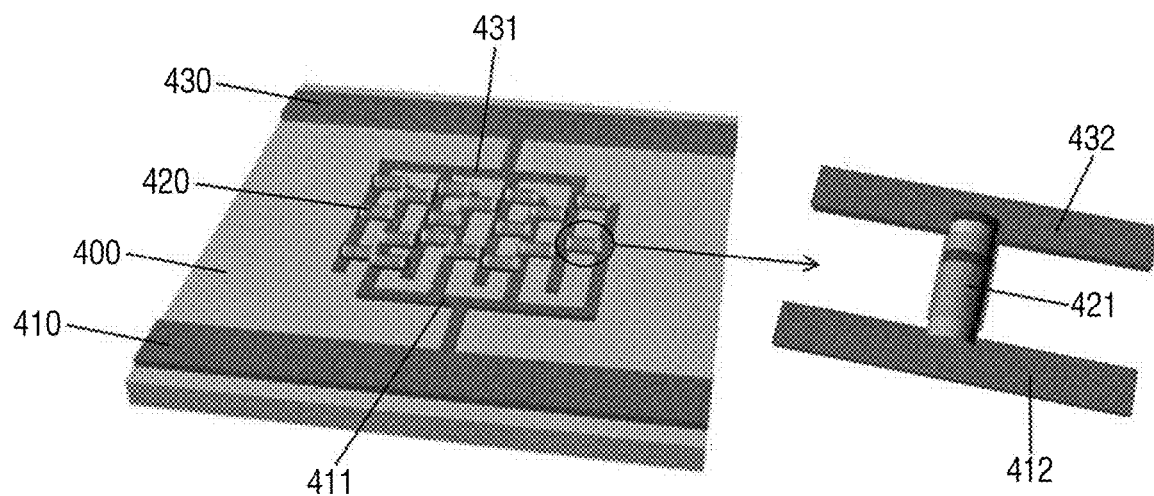
FIG. 2 is a perspective view of a typical electrode assembly including a nano-scale-LED element.

Meanwhile, even when a nano-scale-LED element is mounted on a target electrode region in a two-dimensionally reclined form, it is difficult to adjust the number of nano-scale-LED elements included in a unit electrode region, a positional relationship between the nano-scale-LED element and an electrode, and the like as intended. Since the number of nano-scale-LED elements, which are mountable on a two-dimensional plane, is limited to a unit area of an electrode line, it is difficult to enable a plurality of nano-scale-LED elements capable of obtaining target light intensity to be included in the electrode line having a limited area. A diameter size of each of the nano-scale-LED elements is reduced to address the above described problems, but this causes another problem such as a decrease in light extraction efficiency of each of the nano-scale-LED elements, cost issue in a manufacturing method, and the like. FIG. 2 is a perspective view of a typical electrode assembly including a nano-scale-LED element. FIG. 2 illustrates first electrodes 410, 411, and 412 that are each formed on a base substrate 400, second electrodes 430, 431, and 432 that are each formed to be spaced apart from the first electrodes on the same plane as the first electrodes, and a nano-scale-LED element 421 connected across upper portions of the first electrode 421 and the second electrode 432. In the case of an electrode assembly having such a structure, a nano-scale-LED element is connected across upper portions of two different electrodes to be two-dimensionally disposed, and the number of nano-scale-LED elements, which are mounted on an electrode region, is substantially limited to an upper area of the electrode region so that there is a problem in that it is difficult to obtain target light intensity. Further, since all the nano-scale-LED elements connected to the two different electrodes may not emit light without faults such as an electrical short circuit and the like, there is a problem in that it is more difficult to obtain the target light intensity.

Therefore, the present disclosure solves the above described problems by providing an electrode assembly including nano-scale LED elements, which includes a base substrate, a first electrode formed on the base substrate and having a first lateral surface, a second electrode formed on the base substrate and having a second lateral surface that is disposed to face the first lateral surface of the first electrode, and a plurality of nano-scale-LED elements disposed so that one end of each of the nano-scale-LED elements comes into contact with the first lateral surface and the other end thereof comes into contact with the second lateral surface, and interposed between the first electrode and the second electrode. Through such a solution, an electrode assembly including nano-scale-LED elements having outstanding quality may be implemented to maximize light intensity per unit area thereof by increasing the number of nano-scale-LED elements included in a unit area of the electrode assembly and light extraction efficiency of each of the nano-scale-LED elements, and, at the same time, to connect nano-scale-LED elements fabricated at a nanoscale size to an electrode without faults such as an electrical short circuit and the like.

Figure 3:
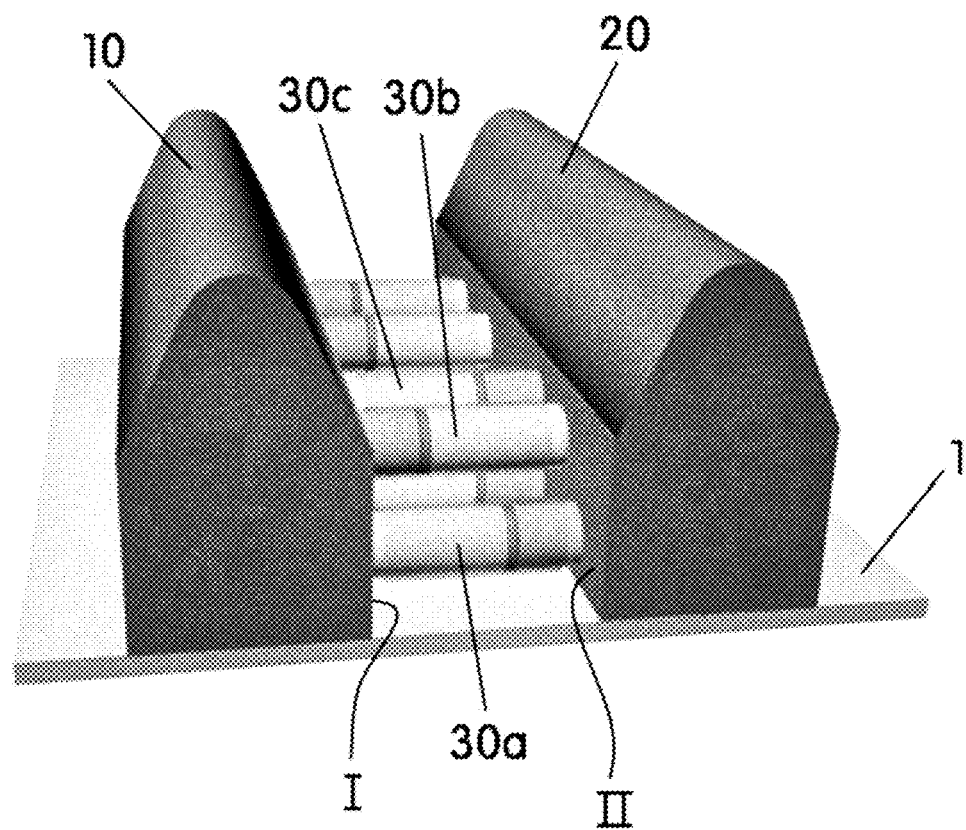
FIG. 3 is a partial perspective view of an electrode assembly according to one preferred embodiment of the present disclosure.

FIG. 3 is a partial perspective view of an electrode assembly according to one preferred embodiment of the present disclosure. FIG. 3 illustrates a first electrode 10 formed on a base substrate 1, a second electrode 20 formed on the base substrate and disposed to face a first lateral surface I of the first electrode, and a plurality of nano-scale-LED elements 30a, 30b, and 30c interposed between the first electrode 10 and the second electrode 20, and which each have one end coming into contact with the first lateral surface I of the first electrode 10 and the other end coming into contact with a second lateral surface II of the second electrode 20.

First, the base substrate 1 that is located below the first electrode 10 and the second electrode 20 will be described.

The base substrate 1 serves as a supporter of the electrode assembly. In the case in which the base substrate 1 is a typical base substrate at which an electrode is formed, the base substrate 1 in the present disclosure may be used without limitation. As a non-limiting example, the base substrate may be one among a glass substrate, a quartz substrate, a sapphire substrate, a plastic substrate, and a flexible polymer film. More preferably, the base substrate may be a transparent substrate. An area of the base substrate is not limited, and the area of the base substrate may be varied in consideration of an area of the first electrode and an area of the second electrode, which are to be formed on the base substrate, a size of a nano-scale-LED element connected to the first electrode and the second electrode, and the number of nano-scale-LED elements connected thereto. Preferably, a thickness of the base substrate may be in a range of 100 nano-scalemeters (μm) to 1 millimeter (mm), but the thickness is not limited thereto.

Next, the first electrode 10 and the second electrode 20, which are formed on the above described base substrate 1, will be described.

Being "on the base substrate" refers to the first electrode 10 and the second electrode 20 being directly formed on a surface of the base substrate, or the first electrode 10 and/or the second electrode 20 being formed over the base substrate to be spaced apart therefrom.

Figure 4:
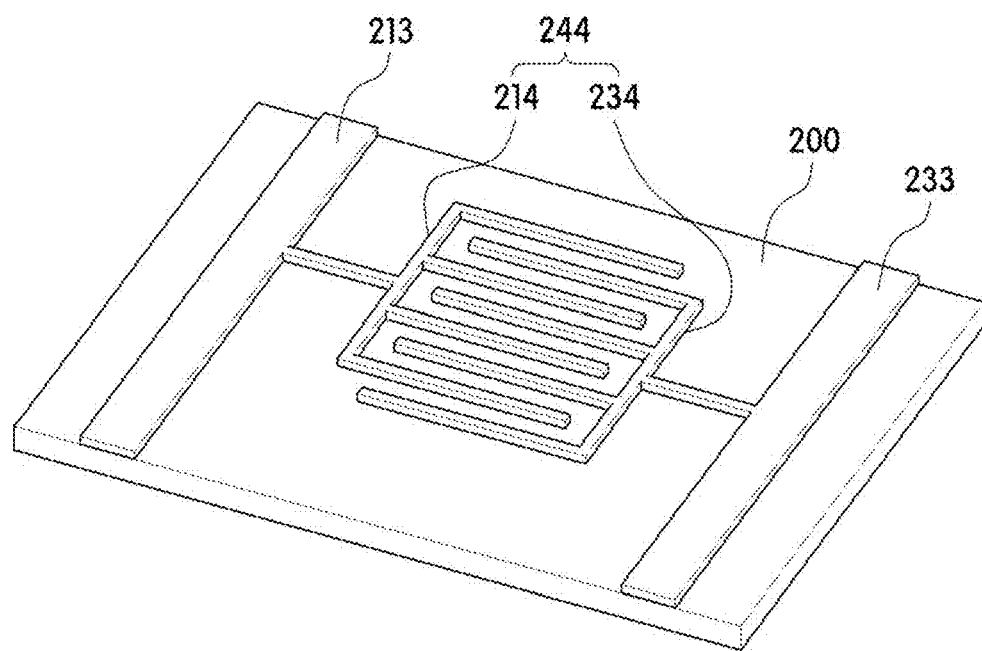
FIG. 4 is a perspective view of electrode lines of a first electrode and a second electrode which are formed on a base substrate according to one preferred embodiment of the present disclosure.

FIG. 4 is a perspective view of electrode lines of a first electrode and a second electrode which are formed on a base substrate according to one preferred embodiment of the present disclosure. All first electrodes 213 and 214 and second electrodes 233 and 234 may be directly formed on a surface of a base substrate 200, and the first electrode 214, which branches from the first electrode 213, and the second electrode 234, which branches from the second electrode 233, may be alternately disposed to form electrode lines 244 which are spaced apart from each other on the same plane.

Figure 5:
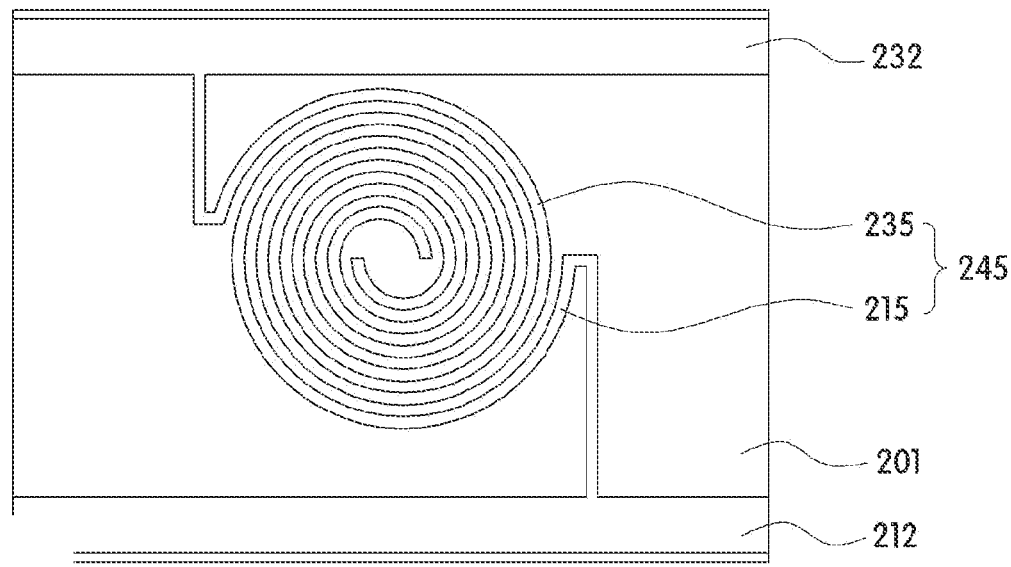
FIG. 5 is a plan view of electrode lines of a first electrode and a second electrode which are formed on a base substrate according to one preferred embodiment of the present disclosure.

Also, FIG. 5 is a plan view of electrode lines of a first electrode and a second electrode which are formed on a base substrate according to one preferred embodiment of the present disclosure. All first electrodes 212 and 215 and second electrodes 232 and 235 may be directly formed on a surface of a base substrate 201, and the first electrode 215, which branches from the first electrode 212, and the second electrode 235, which branches from the second electrode 232, may be vertically disposed to form electrode lines 245 which are spaced apart from each other on the same plane.

Figure 6:
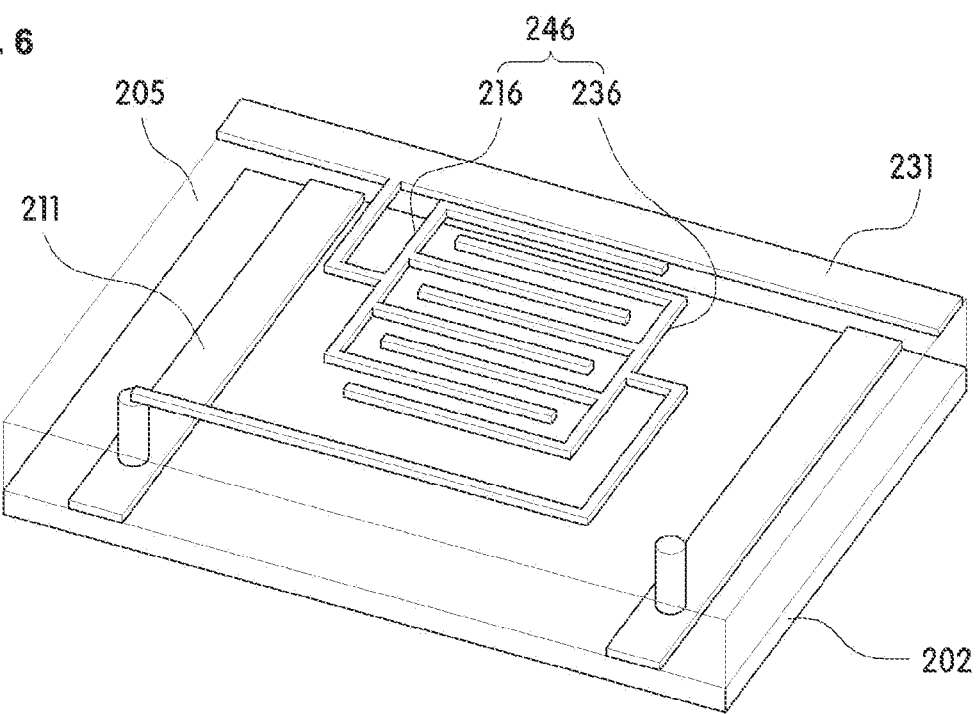
FIG. 6 is a perspective view of electrode lines of a first electrode and a second electrode which are formed on a base substrate according to one preferred embodiment of the present disclosure.

Also, FIG. 6 is a perspective view of electrode lines of a first electrode and a second electrode which are formed on a base substrate according to one preferred embodiment of the present disclosure. A first electrode 211 is directly formed on a surface of a base substrate 202, whereas second electrodes 231 and 216 are formed over the base substrate 202 to be spaced apart therefrom, and a first electrode 236, which branches from the first electrode 211, is connected thereto through a connection electrode and is formed over the base substrate 202 to be spaced apart from the first electrode 211, and the first electrode 236 branched from the first electrode 211 and the second electrode 216, which branches from the second electrode 231, may be alternately disposed on the same plane to form electrode lines 246 which are spaced apart from each other.

When the electrode lines are configured in an alternate disposition or a vertical disposition as described above, a drive area of a unit electrode capable of independently driving nano-scale-LED elements which are included in the base substrate 200, 201, or 202 having a limited area may be increased so that the number of nano-scale-LED elements which are mounted on a unit electrode area may be increased through a disposition of electrodes. This may increase light emitting intensity per unit area of the nano-scale-LED element so that the nano-scale-LED element may be useful in an application of various opto-electronic devices which require high brightness per unit area. Meanwhile, FIGS. 4 to 6 illustrate one preferred embodiment, and the present disclosure is not limited thereto and may further be modified and implemented in various manners according to the purpose of the present disclosure through a disposition of all imaginable structures in which two electrodes are spaced apart from each other at regular intervals.

Meanwhile, the first electrode 10 and the second electrode 20 may each be configured with a material that is generally used as an electrode. As a non-limiting example, the first electrode 10 and the second electrode 20 may each be independently configured with one or more metal materials selected from a group consisting of aluminum, titanium, indium, gold, and silver, or one or more transparent materials selected from a group consisting of indium tin oxide (ITO), ZnO:Al, and a carbon nanotube (CNT)-conductive polymer complex. When two or more kinds of electrode materials are used, the first electrode 10 and/or the second electrode 20 may preferably have a structure in which the two or more kinds of electrode materials are stacked. More preferably, the first electrode 10 and/or the second electrode 20 may be an electrode in which two kinds of materials, that is, titanium and gold are stacked. However, the materials of the first electrode 10 and/or the second electrode 20 are not limited to the above described materials. Also, the materials of the first electrode 10 and/or the second electrode 20 may be the same as or different from each other.

In addition, heights of the first electrode 10 and the second electrode 20 (each of the heights corresponding to a thickness in an upward direction that is perpendicular to the base substrate) may be designed to be different from each other according to a purpose of each of the first electrode 10 and the second electrode 20. In accordance with one preferred embodiment of the present disclosure, a height of each of the first lateral surface I of the first electrode 10 and the second lateral surface II of the second electrode may be formed to be from 1.1 to 10 times a diameter of the nano-scale-LED element, more preferably, to be from 2 to 10 times the diameter of the nano-scale-LED so that the nano-scale-LED element may form a multilayer in a height direction of each of two different adjacent electrodes in a separation space between the two different adjacent electrodes. When the height of one of the lateral surfaces of the two different adjacent electrodes is less than 1.1 times the diameter of the nano-scale-LED element, the nano-scale-LED element may be inserted into the separation space between the two different adjacent electrodes and connected to the two different adjacent electrodes, but may not form the multilayer since the height of the lateral surface is small. Because such a case is the same as the case in which the nano-scale-LED element is disposed at the electrode region, that is, in a two-dimensional plane, there is a problem in that a physical property that is the target of the present disclosure may not be implemented. Also, when the height of one of the lateral surfaces of the two different adjacent electrodes exceeds 10 times the diameter of the nano-scale-LED element, the number of nano-scale-LED elements which are inserted into the separation space between the two different adjacent electrodes and connected to the two different adjacent electrodes may be uneconomically increased, and, at the same time, it may be difficult to enable all the nano-scale-LED elements to emit light due to a connection problem with the two different adjacent electrodes. Further, even when a nano-scale-LED element located at a lower layer among a plurality of layers emits light, the light may be blocked by a nano-scale-LED element that is disposed over the nano-scale-LED element located at the lower layer so that there may be a problem in that light extraction efficiency is not significantly increased.

In addition, each of the first lateral surface I of the first electrode 10 and the second lateral surface II of the second electrode may preferably be disposed perpendicular to the base substrate. When the first lateral surface I and the second lateral surface II are each formed to be inclined with respect to the base substrate, a distance between the first electrode 10 and the second electrode 20 varies according to the height of the first lateral surface I or the second lateral surface II so that there is a problem in that it may be difficult to interpose the nano-scale-LED element between the first electrode 10 and the second electrode 20 in the form of the multilayer based on the base substrate. Although the nano-scale-LED element is interposed between the first electrode 10 and the second electrode 20, a fault occurs in a positional relationship between the nano-scale-LED elements so that there is a problem in that the number of nano-scale-LED elements that may be included in a unit volume of a separation space between the first electrode 10 and the second electrode 20 may be decreased.

In addition, the first lateral surface I of the first electrode 10 and the second lateral surface II of the second electrode may preferably be formed to be perpendicular to the base substrate, and, at the same time, to be parallel to each other. In the case in which the lateral surfaces I and II of the first electrode 10 and the second electrode 20 are not parallel to each other even when disposed perpendicular to the base substrate, the distance between the first electrode 10 and the second electrode 20 varies in a length direction of each of the first electrode 10 and the second electrode 20 (that is, the distance is gradually increased or decreased) so that it may be difficult to interpose the nano-scale-LED element therebetween based on the base substrate. Although the nano-scale-LED element is interposed between the first electrode 10 and the second electrode 20, a fault occurs in the positional relationship between the nano-scale-LED elements so that there is a problem in that the number of nano-scale-LED elements that may be included in a unit volume of the separation space between the first electrode 10 and the second electrode 20 may be decreased.

Further, the lateral surfaces I and II facing each other of the first electrode 10 and the second electrode 20 may each be provided to be flat so as to enable a surface contact between both ends of the nano-scale-LED element and the lateral surfaces I and II of the first electrode 10 and the second electrode 20. When one end of the nano-scale-LED element is connected to the lateral surface I or II of the first electrode 10 or the second electrode 20 through the surface contact, an electrical connection thereof may be superior when compared to that of a point or line contact so that there is an advantage in that a fault is prevented from occurring.

Also, a cross-sectional shape of each of the first electrode 10 and the second electrode 20 may vary in a vertical direction with respect to the base substrate, and the cross-sectional shape may include a portion at which a width of the first electrode 10 or the second electrode 20 narrows toward the upward direction that is perpendicular to the base substrate. An outer surface corresponding to the portion at which the width narrows in the cross-sectional shape of the first electrode 10 or the second electrode 20 may not be a portion on which the nano-scale-LED element is substantially mounted. When the first electrode 10 or the second electrode 20 having such a cross-sectional shape is employed, the nano-scale-LED element may be more easily located in the separation space between the first electrode 10 and the second electrode 20 during a manufacturing process of the electrode assembly which will be described below. A detailed description of the above-described nano-scale-LED element will be followed by a description of a manufacturing process which will be described below.

Also, a width of each of the first electrode 10 and the second electrode 20 may be in a range of 100 nanometers (nm) to 50 µm, but is not limited thereto, and the width may be designed to be different according to a detailed disposition of the first electrode 10 and the second electrode 20 and an application field thereof. In addition, a thickness of each of the first electrode 10 and the second electrode 20 may be in a range of 200 nm to 50 µm, but is not limited thereto, and the thickness may be designed to be different according to the diameter of the nano-scale-LED element.

Meanwhile, a distance between the first lateral surface I of the first electrode 10 and the second lateral surface II of the second electrode 20 may be designed to be different according to a detailed shape, length, and diameter of the nano-scale-LED element without limitation to a concrete shape, length, and diameter thereof, and preferably, the diameter thereof may be less than or equal to the length of the nano-scale-LED element.

Further, the electrode assembly according to the present disclosure is provided such that one end of the electrode assembly is disposed to come into contact with the first lateral surface of the first electrode that has been described in detail, and the other end thereof is disposed to come into contact with the second lateral surface of the second electrode that has been described in detail, and the electrode assembly includes a plurality of nano-scale-LED elements interposed between the first electrode and the second electrode.

In particular, as shown in FIG. 3, the plurality of nano-scale-LED elements 30a, 30b, and 30c are inserted into the separation space between the first electrode 10 and the second electrode 20 and connected to the first electrode 10 and the second electrode 20 so that one end of each of the plurality of nano-scale-LED elements 30a, 30b, and 30c comes into contact with the first lateral surface I of the first electrode 10 and the other end thereof comes into contact with the second lateral surface II of the second electrode 20 adjacent to the first electrode 10. The plurality of nano-scale-LED elements 30a, 30b, and 30c are laid in parallel with the base substrate in a length direction of each of the plurality of nano-scale-LED elements 30a, 30b, and 30c to be connected to adjacent electrodes, that is, the first electrode 10 and the second electrode 20.

First, a positional relationship between the plurality of nano-scale-LED elements will be described, wherein the plurality of nano-scale-LED elements are each inserted between the first lateral surface I of the first electrode 10 and the second lateral surface II of the second electrode 20, which is disposed to face the first lateral surface I of the first electrode 10, to be connected to the first electrode 10 and the second electrode 20.

In accordance with one preferred embodiment of the present disclosure, the plurality of nano-scale-LED elements may be inserted between the first electrode and the second electrode and connected to the first electrode and the second electrode to form the multilayer based on the base substrate.

Figure 7:
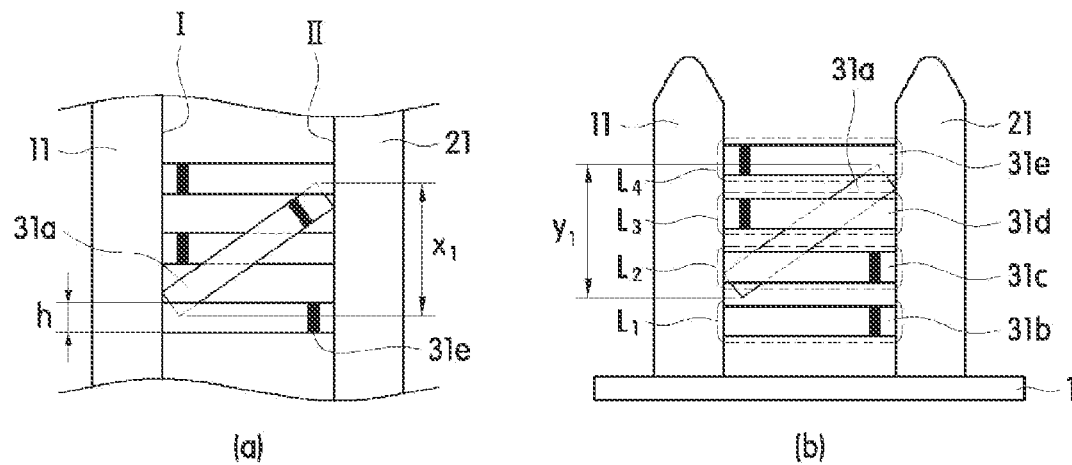
FIG. 7 is a plan view and a front view of an electrode assembly according to one preferred embodiment of the present disclosure.

FIG. 7A is a plan view of an electrode assembly according to another one preferred embodiment of the present disclosure. FIG. 7A illustrates nano-scale-LED elements 31a and 31e which are inserted between a first lateral surface I of a first electrode 11, which is perpendicular to a base substrate (not shown), and a second lateral surface II of a second electrode 21, which is disposed to be parallel to and to face the first lateral surface I, to be connected to the first electrode 11 and the second electrode 21. Also, FIG. 7B is a front view with respect to FIG. 7A, and illustrates a plurality of nano-scale-LED elements 31a, 31b, 31c, 31d, and 31e which are inserted into a separation space between the first electrode 11 and the second electrode 21 which are formed on a base substrate 1 to be connected to the first electrode 11 and the second electrode 21. At this point, the plurality of nano-scale-LED elements 31b, 31c, 31d, and 31e form layers L1, L2, L3 and L4 based on the base substrate 1. In FIGS. 7A and 7B, a length direction of a first nano-scale-LED element 31a is inclined with respect to the base substrate 1, and the first nano-scale-LED element 31a is inserted between the first electrode 11 and the second electrode 21 to be inclined thereto instead of being perpendicular to each of the first electrode 11 and the second electrode 21, and thus is connected to the first electrode 11 and the second electrode 21. As will be described in the manufacturing process which will be described below, each of the nano-scale-LED elements may not be manually assembled between the electrodes but may be interposed between the electrodes as the first nano-scale-LED element 31a included in the electrode assembly shown in FIGS. 7A and 7B. However, in the separation space between the first electrode 11 and the second electrode 21, a region occupied by the first nano-scale-LED element may be greater than that occupied by each of the remaining nano-scale-LED elements 31b, 31c, 31d, and 31e so that the number of nano-scale-LED elements which may be included in a limited volume of the separation space may be reduced. In particular, a length $x_1$ occupied by the first nano-scale-LED element 31a in FIG. 7A is greater than a diameter h of the nano-scale-LED element, and a height $y_1$ occupied by the first nano-scale-LED element 31a in FIG. 7B is also greater than the diameter h of the nano-scale-LED element, and thus a separation space (having the length $x_1$, a width which is the distance between the first electrode 11 and the second electrode 21, and the height $y_1$) occupied by the first nano-scale-LED element may be significantly greater than a separation space S2 (having a length h, a width which is the distance between the first electrode 11 and the second electrode 21, and a height h) occupied by another nano-scale-LED element 31b so that a space in which the other nano-scale-LED element is interposed may be reduced.

Figure 8:
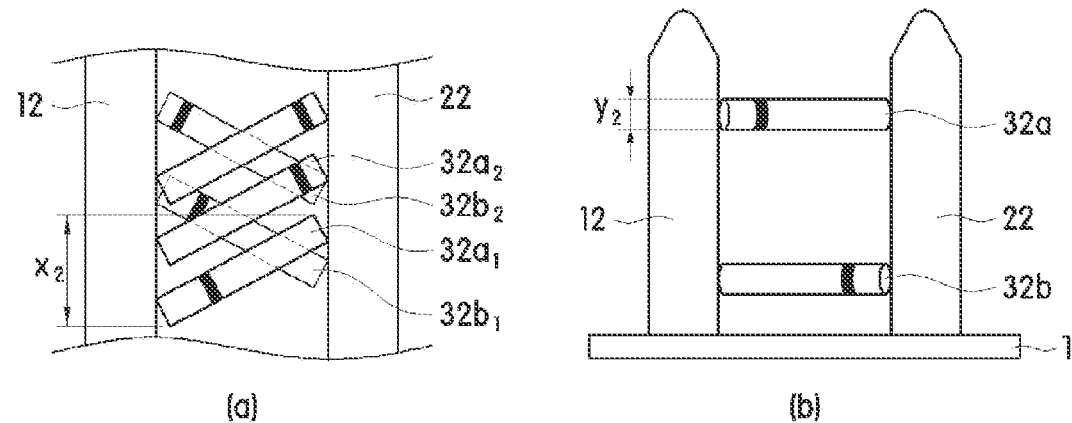
FIG. 8 is a plan view and a front view of an electrode assembly according to one preferred embodiment of the present disclosure.

Therefore, in accordance with another one preferred embodiment of the present disclosure, the nano-scale-LED elements may be disposed to be parallel to the base substrate or between the nano-scale-LED elements in the length direction of each of the nano-scale-LED elements to be interposed in the separation space between the first electrode and the second electrode. More preferably, the nano-scale-LED elements may be disposed to be parallel not only to the base substrate but also between the nano-scale LED elements in the length direction of each of the nano-scale LED elements to be interposed between the first electrode and the second electrode. FIG. 8A is a plan view of the electrode assembly according to one preferred embodiment of the present disclosure. FIG. 8A illustrates nano-scale-LED elements 32a and 32b which each are inserted between a first lateral surface of a first electrode 12, which is perpendicular to a base substrate (not shown), and a second lateral surface of a second electrode 22, which is disposed to be parallel thereto and to face the first lateral surface, to be connected to the first electrode 11 and the second electrode 21. At this point, some nano-scale-LED elements $32a_1$ and $32a_2$ are disposed in parallel with each other in a length direction and interposed between the first and second electrodes, and other nano-scale-LED elements $32b_1$ and $32b_2$ are also disposed in parallel with each other in the length direction and interposed between the first and second electrodes. Also, FIG. 8B is a front view with respect to FIG. 8A and illustrates the plurality of nano-scale-LED elements $32a$ and $32b$ which are inserted into a separation space between the first electrode 12 and the second electrode 22 which are formed on a base substrate 1 to be connected to the first electrode 12 and the second electrode 22. At this point, the plurality of nano-scale-LED elements $32a$ and $32b$ form a two-stage multilayer that is parallel to the base substrate 1. As shown in FIG. 8B, when the two-stage multilayer that is parallel to the base substrate 1 is formed, a height which is occupied by each of the plurality of nano-scale-LED elements $32a$ and $32b$ in the separation space corresponds to a diameter $y_2$ of each of the plurality of nano-scale-LED elements $32a$ and $32b$ such that there may be an advantage in that the number of layers that may be included in an electrode having a limited height may be significantly increased. Meanwhile, in the electrode assembly shown in FIG. 8A, the plurality of nano-scale-LED elements are disposed in parallel with each other in the length direction of each of the plurality of nano-scale-LED elements and are interposed between the electrodes so that a volume of the separation space occupied by the plurality of nano-scale-LED elements may be reduced in comparison to that of when the plurality of nano-scale-LED elements are irregularly interposed between the electrodes instead of being interposed in parallel with each other in the length direction. On the other hand, the volume of the separation space may be increased in comparison to that of when the plurality of nano-scale-LED elements are not only disposed in parallel with each other in the length direction but are also connected perpendicular to both the first electrode and the second electrode such that there is a problem in that the number of nano-scale-LED elements that may be included in the separation space may be reduced.

Figure 9:
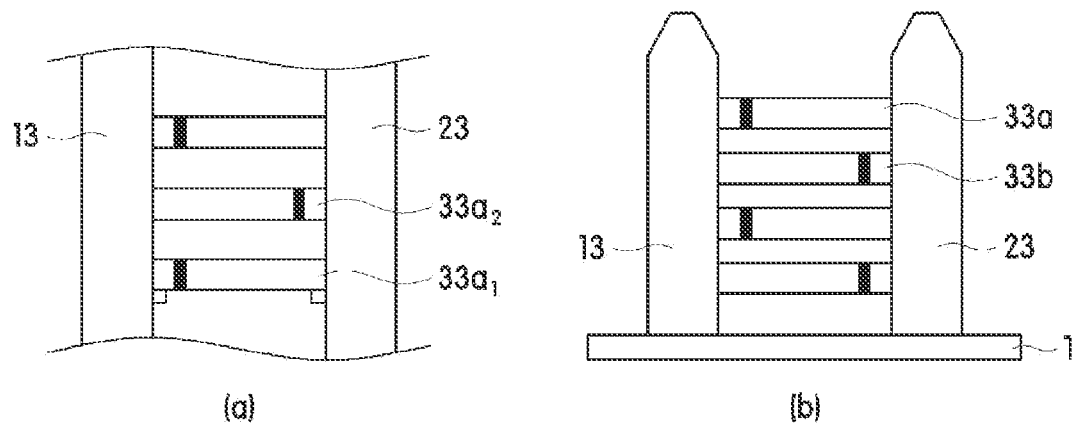
FIG. 9 is a plan view and a front view of an electrode assembly according to one preferred embodiment of the present disclosure.

Accordingly, in accordance with one preferred embodiment of the present disclosure, the plurality of nano-scale-LED elements may be connected to be perpendicular to the lateral surface of each of the electrodes in the length direction of each of the plurality of nano-scale-LED elements. FIG. 9 is a plan view and a front view of an electrode assembly according to still another one preferred embodiment of the present disclosure. FIG. 9 illustrates nano-scale-LED elements $33a_1$ and $33a_2$ which are inserted between a first lateral surface of a first electrode 13, which is perpendicular to a base substrate (not shown), and a second lateral surface of a second electrode 23, which is disposed to be parallel to and to face the first lateral surface, to be connected to the first electrode 13 and the second electrode 23. At this point, the nano-scale-LED elements $33a_1$ and $33a_2$ are disposed in parallel with each other in a length direction and are interposed between both the first electrode 13 and the second electrode 23 to be perpendicular thereto in the length direction. Also, FIG. 9B illustrates the plurality of nano-scale-LED elements $33a$ and $33b$ which are inserted into a separation space between the first electrode 13 and the second electrode 23 which are formed on a base substrate 1 to be connected to the first electrode 13 and the second electrode 23. At this point, nano-scale-LED elements $33a$ (that is, $33a_1$ and $33a_2$) form a first layer that is parallel to the base substrate 1 and nano-scale-LED elements $33b$ form a second layer that is parallel to the base substrate 1 and is spaced apart from the first layer so that the plurality of nano-scale-LED elements included in the electrode assembly of FIG. 9B form a four-stage multilayer.

Figure 10:
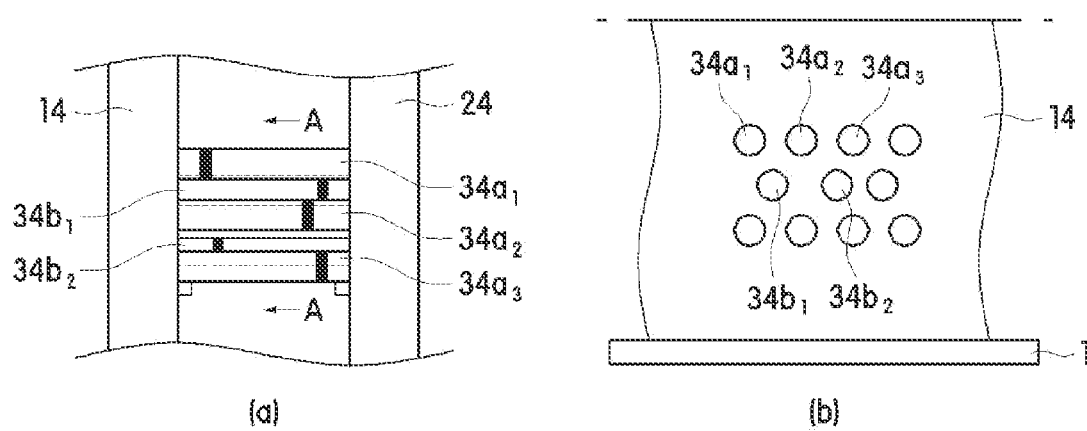
FIG. 10 is a plan view and a cross-sectional view taken along line A-A of an electrode assembly according to one preferred embodiment of the present disclosure

Meanwhile, FIG. 10 is a plan view and a cross-sectional view taken along line A-A of the electrode assembly according to still another one preferred embodiment of the present disclosure. FIG. 10A illustrates nano-scale-LED elements $34a_1$, $34a_2$, $34a_3$, $34b_1$, and $34b_2$ which are inserted between a first lateral surface of a first electrode 14, which is perpendicular to a base substrate (not shown), and a second lateral surface of a second electrode 24, which is disposed to be parallel to and to face the first lateral surface, to be connected to the first electrode 14 and the second electrode 24. At this point 1, the nano-scale-LED elements $34a_1$, $34a_2$, $34a_3$, $34b_1$, and $34b_2$ are disposed in parallel with each other in a length direction and are interposed between both the first electrode 14 and the second electrode 24 to be perpendicular thereto in the length direction. Also, FIG. 10B is the cross-sectional view taken along line A-A of FIG. 10A and illustrates a cross section of each of the nano-scale-LED elements $34a_1$, $34a_2$, $34a_3$, $34b_1$, and $34b_2$ which has one end coming into contact with the first electrode 14 formed on a base substrate 1. In FIG. 10B, the nano-scale-LED elements $34a_1$, $34a_2$, and $34a_3$ form a first layer that is parallel to the base substrate 1, and the nano-scale-LED elements $34b_1$ and $34b_2$ form a second layer that is parallel to the base substrate 1 and is spaced apart from the first layer, and FIG. 10B illustrates a three-stage multilayer. At this point, a second nano-scale-LED element $34b_1$ included in the second layer is located below a separation space between a third nano-scale-LED element $34a_1$ and a fourth nano-scale-LED element $34a_2$ which are included in the first layer, instead of being located vertically below the third nano-scale-LED element $34a_1$ included in the first layer. With such a configuration, it is possible to minimize blockage of light emitted from the second nano-scale-LED element $34b_1$ included in the second layer by the third nano-scale-LED element $34a_1$ included in the first layer such that the light does not propagate toward a front portion that is perpendicular to the base substrate.

Figure 11:
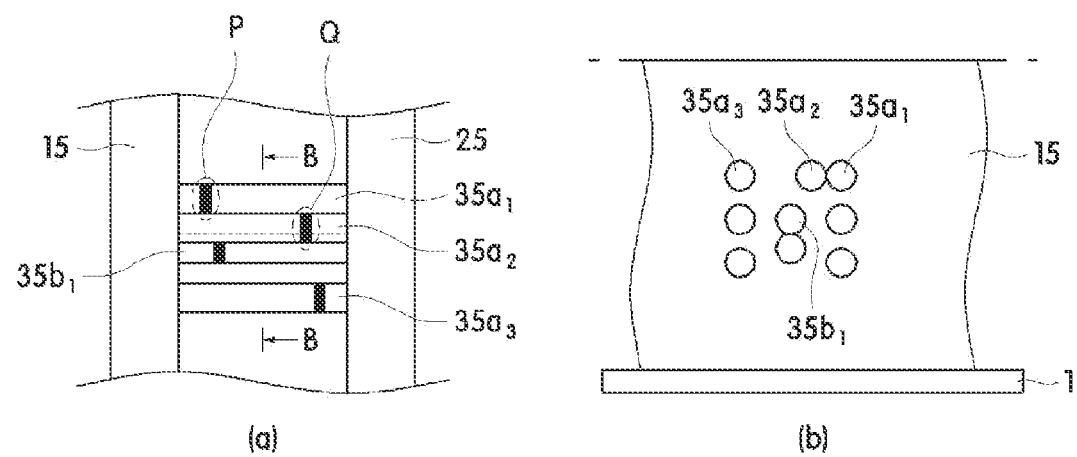
FIG. 11 is a plan view and a cross-sectional view taken along line B-B of an electrode assembly according to one preferred embodiment of the present disclosure.

Also, FIG. 11 is a plan view and a cross-sectional view taken along line B-B of an electrode assembly according to one preferred embodiment of the present disclosure. FIG. 11A illustrates nano-scale-LED elements $35a_1$, $35a_2$, $35a_3$, and $35b_1$ which are inserted between a first lateral surface of a first electrode 15, which is perpendicular to a base substrate (not shown), and a second lateral surface of a second electrode 25, which is disposed to be parallel to and to face the first lateral surface, to be connected to the first electrode 15 and the second electrode 25. At this point, the nano-scale-LED elements $35a_1$, $35a_2$, $35a_3$, and $35b_1$ are disposed in parallel with each other in a length direction and are interposed between both the first electrode 15 and the second electrode 25 to be perpendicular thereto in the length direction.

At this point, in FIGS. 11A and 11B, outer surfaces of the fifth nano-scale-LED element $35a_1$ and the sixth nano-scale-LED element $35a_2$ come into line contact with each other in the length direction. A typical nano-scale-LED element includes an active layer in which an electron-hole pair is formed to generate light, and the active layer is generally formed not only at a central position of the typical nano-scale-LED element but also at a position biased toward one end of the typical nano-scale-LED element. Positions of active layers in nano-scale-LED elements which are grown and manufactured may be different from each other, and in the case of the typical LED element, the active layer is exposed to an outer surface of the typical LED element. When the active layer comes into contact with an electrode of an electrode line to which electrical power is directly applied or with a semiconductor layer of a nano-scale-LED element to which electrical power is applied, an electrical short circuit may occur at such a nano-scale-LED element and the nano-scale-LED element may not emit light.

In particular, as shown in FIG. 11A, an active layer (P in FIG. 11A) of the fifth nano-scale-LED element $35a_1$ comes into contact with a conductive semiconductor layer (or an electrode layer that may be formed below the conductive semiconductor layer) of the sixth nano-scale-LED element $35a_2$, and, at the same time, an active layer (Q in FIG. 11A) of the sixth nano-scale-LED element $35a_2$ comes into contact with a conductive semiconductor layer (or an electrode layer that may be formed below the conductive semiconductor layer) of the fifth nano-scale-LED element $35a_1$. When electrical power is applied to the first electrode 15 and the second electrode 25, an electrical short circuit may occur even though the fifth nano-scale-LED element $35a_1$ and the sixth nano-scale-LED element $35a_2$ are disposed between the first electrode 15 and the second electrode 25 and the fifth nano-scale-LED element $35a_1$ and the sixth nano-scale-LED element $35a_2$ may not emit light. When such a fault frequently occurs, even though the number of nano-scale-LED elements that are included in a separation space between the two different electrodes is significantly increased, an electrode assembly capable of obtaining target light intensity may not be implemented.

To address the above described problem and to interpose more nano-scale-LED elements in a separation space which is limited in size, in accordance with one preferred embodiment of the present disclosure, a nano-scale-LED element may include a first conductive semiconductor layer, an active layer formed on the first conductive semiconductor layer, a second conductive semiconductor layer formed on the active layer, and an insulating film configured to entirely cover at least an outer surface of the active layer of an entire outer surface of the nano-scale-LED element.

Figure 15:
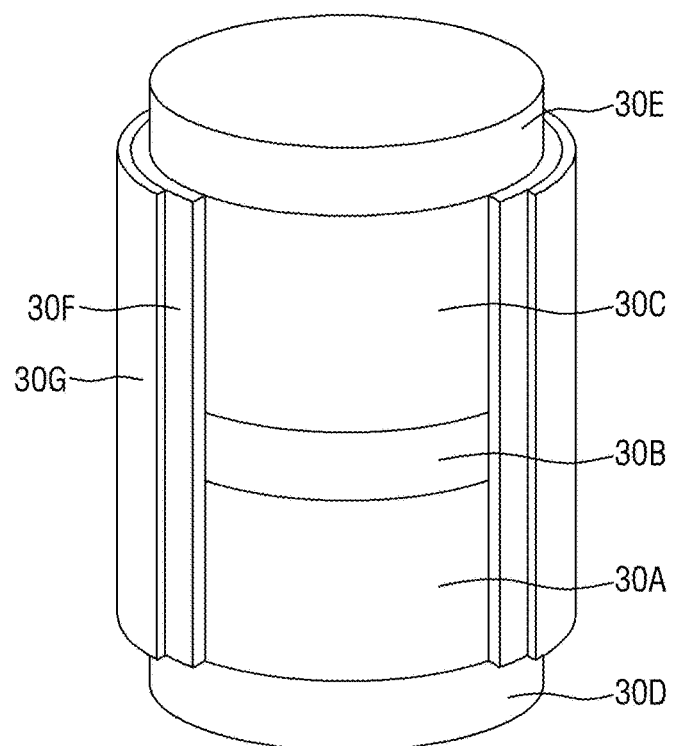
FIG. 15 is a perspective view illustrating one embodiment of a nano-scale-LED element included in the present disclosure.

FIG. 15 is a perspective view illustrating one embodiment of a nano-scale-LED element included in the present disclosure, and illustrates an active layer 30B formed on a first conductive semiconductor layer 30A, a second conductive semiconductor layer 30C formed on the active layer 30B, and an insulating film 30F configured to cover outer surfaces of the first conductive semiconductor layer 30A, the active layer 30B, and the second conductive semiconductor layer 30C.

Since the insulating film 30F covers the outer surface of the active layer 30B, even though electricity is directly applied to the outer surface of the active layer 30B of the nano-scale-LED element, the active layer 30B may be protected by the insulating film 30F so that an electrical short circuit of the nano-scale-LED element may be prevented. Accordingly, an outer surface of the nano-scale-LED element included in one preferred embodiment of the present disclosure may include the insulating film 30F configured to entirely cover at least the outer surface of the active layer. When the insulating film is coated on the outer surface of the nano-scale-LED element that includes the active layers of the fifth nano-scale-LED element $35a.\text{sub}.1$ and the sixth nano-scale-LED element $35a.\text{sub}.2$ in FIG. 11A, an electrical short circuit may not occur when electrical power is applied thereto even though the fifth nano-scale-LED element $35a_1$ and the sixth nano-scale-LED element $35a_2$ are interposed between the first electrode 15 and the second electrode 25 to enable the outer surfaces of the two nano-scale-LED elements to come into line contact with each other. In addition, the insulating film 30F may preferably be coated even on one or more of the outer surfaces of the first conductive semiconductor layer 30A and the second conductive semiconductor layer 30C to simultaneously prevent an electrical short circuit and a degradation of durability of the nano-scale-LED element due to damage to the outer surfaces of the semiconductor layers.

Figure 12:
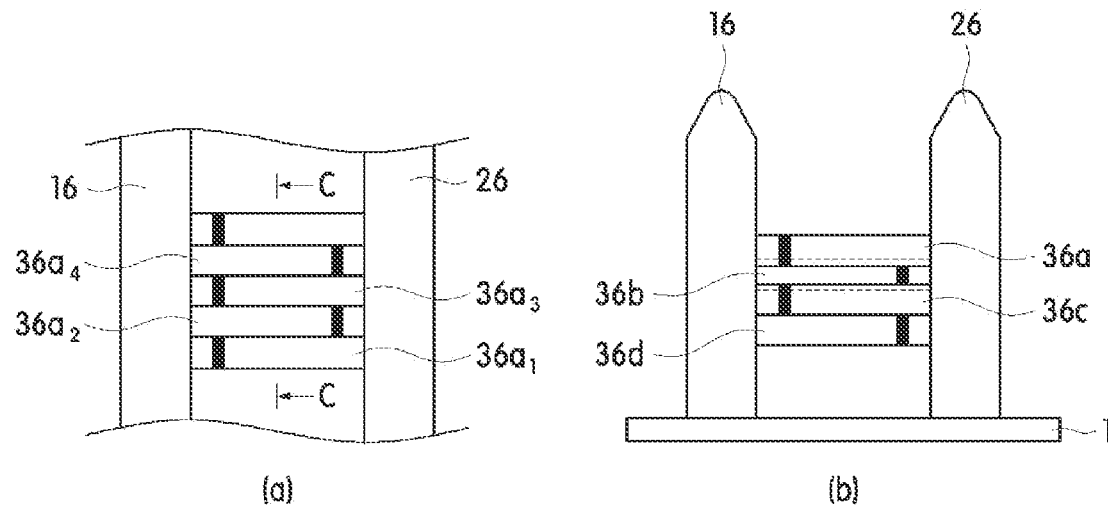
FIG. 12 is a plan view and a cross-sectional view taken along line C-C of an electrode assembly according to one preferred embodiment of the present disclosure.

Therefore, an electrode assembly according to another one preferred embodiment of the present disclosure may be configured such that nano-scale-LED elements may be interposed in a separation space between two different adjacent electrodes by maximally packing outer surfaces of the nano-scale-LED elements to come into contact with each other vertically and horizontally with respect to a base substrate. With such a configuration, the number of nano-scale-LED elements included in the separation space per unit volume may be significantly increased, and, at the same time, an electrical short circuit of the nano-scale-LED element may not occur so that outstanding light intensity is obtained. FIG. 12 is a plan view and a cross-sectional view taken along line C-C of an electrode assembly according to another one preferred embodiment of the present disclosure. FIG. 12A illustrates nano-scale-LED elements $36a_1$, $36a_2$, $36a_3$, and $36a_4$ which are inserted between a first lateral surface of a first electrode 16, which is perpendicular to a base substrate (not shown), and a second lateral surface of a second electrode 26, which is disposed to be parallel to and to face the first lateral surface, to be connected to the first electrode 16 and the second electrode 26. At this point, the nano-scale-LED elements $36a_1$, $36a_2$, $36a_3$, and $36a_4$ are disposed in parallel with each other in a length direction and are interposed between both the first electrode 16 and the second electrode 26 to be perpendicular thereto in the length direction, and, at the same time, outer surfaces of the nano-scale-LED elements come into contact with each other. Also, FIG. 12B is the cross-sectional view taken along line C-C of FIG. 12A and illustrates a cross section of each of the nano-scale-LED elements $36a_1$, $36b$, $36c$, and $36d$ that has one end coming into contact with the first electrode 16 formed on a base substrate 1. In FIG. 12B, the nano-scale-LED element $36a_1$ forms a first layer that is parallel to the base substrate 1, and the nano-scale-LED element $36b$ forms a second layer that is parallel to the base substrate 1 and comes into contact with the first layer, the nano-scale-LED element $36c$ forms a third layer that is parallel to the base substrate 1 and comes into contact with the second layer, and FIG. 12B illustrates a multilayer in which four stage layers each come into contact with layers adjacent thereto. As shown in FIG. 12B, when the plurality of nano-scale-LED elements are packed in a separation space between the two adjacent electrodes 16 and 26, the number of nano-scale-LED elements included in the separation space that is limited in size may be significantly increased, and an insulating film may be further coated on an outer surface corresponding to an active layer of each of the plurality of nano-scale-LED elements to prevent an electrical short circuit so that an electrode assembly capable of obtaining target light intensity may be implemented without faults.

Figure 13:
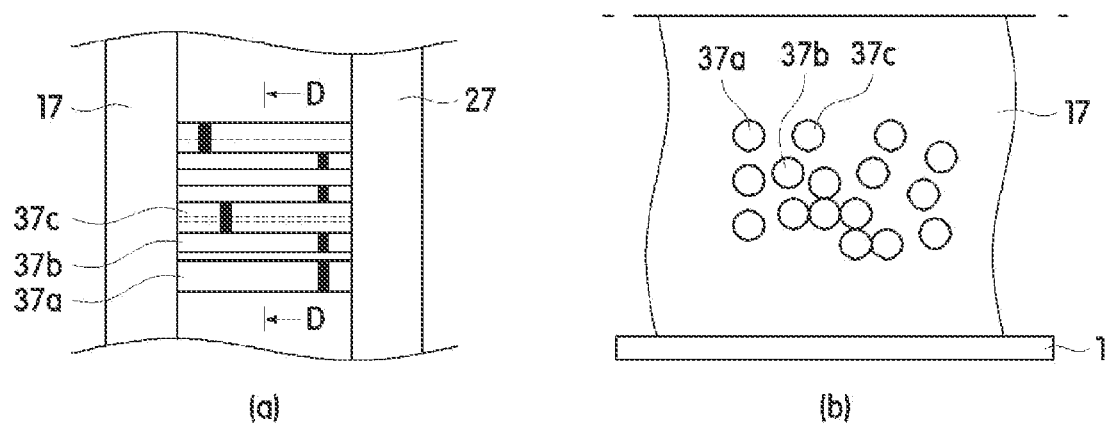
FIG. 13 is a plan view and a cross-sectional view taken along line D-D of an electrode assembly according to one preferred embodiment of the present disclosure.

Meanwhile, in accordance with one preferred embodiment of the present disclosure, nano-scale-LED elements interposed in a separation space between two different adjacent electrodes may randomly form a multilayer based on a base substrate. FIG. 13 is a plan view and a cross-sectional view taken along line D-D of an electrode assembly according to one preferred embodiment of the present disclosure. As can be seen from FIGS. 13A and 13B, nano-scale-LED elements $37a$, $37b$, and $37c$ may randomly form a multilayer in a separation space between a first electrode 17 and a second electrode 27, some of the nanoscale-LED elements may be spaced apart from each other without contact between outer surfaces of some of the nano-scale-LED elements, and the remaining nano-scale-LED elements may be interposed between the electrodes to enable outer surfaces of the remaining nano-scale-LED elements to come into contact with each other.

In accordance with still another one preferred embodiment of the present disclosure, both ends of a nano-scale-LED element included in an electrode assembly may each include a convex curved surface.

Figure 14:
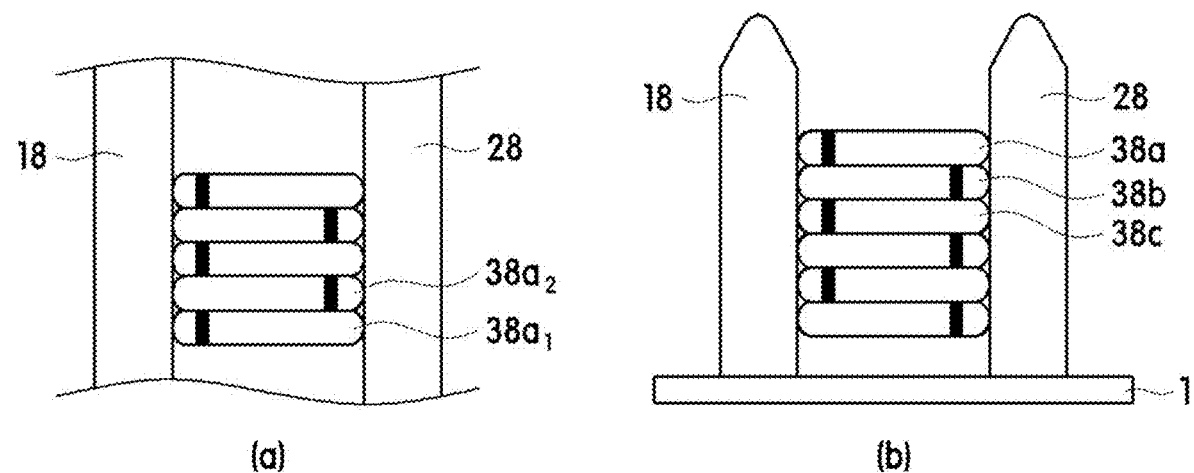
FIG. 14 is a plan view and a front view of an electrode assembly according to one preferred embodiment of the present disclosure.

FIG. 14 is a plan view and a front view of an electrode assembly according to still another one preferred embodiment of the present disclosure. Each of both ends of nano-scale-LED elements $38a_1$ and $38a_2$, which are inserted into a separation space between a first electrode 18 and a second electrode 28 which are formed on a base substrate 1 to be connected to the first electrode 18 and the second electrode 28, includes a convex curved surface. When each of both of the ends of a nano-scale-LED element includes the convex curved surface, in a process of self-aligning the nano-scale-LED element during a manufacturing process of an electrode assembly which will be described below, there is an advantage in that the nano-scale-LED element may be inserted into two different electrodes to more easily enable lateral surfaces of the two different electrodes to be approximately perpendicular to a length direction of the nano-scale-LED element and may be connected to the two different electrodes, and a detailed description thereof will be described in the manufacturing process which will be described below.

Meanwhile, another one embodiment of the present disclosure includes a plurality of nano-scale-LED elements disposed in a separation space between first and second electrodes with lateral surfaces facing each other so that one end of each of the plurality of nano-scale-LED elements may come into contact with the lateral surface of the first electrode and the other end thereof may come into contact with the lateral surface of the second electrode, and $1 \times 10^3$ to $1 \times 10^{12}/\text{mm}^3$ of the plurality of nano-scale-LED elements are included an electrode assembly.

The electrode assembly is configured such that the plurality of nano-scale-LED elements are disposed to form a multilayer in the separation space between the first and second electrodes with the lateral surfaces facing each other so that $1 \times 10^3$ to $1 \times 10^{12}/\text{mm}^3$ of the plurality of nano-scale-LED elements are interposed in the separation space, which is significantly increased in comparison to that of when the plurality of nano-scale-LED elements are simply mounted on a single plane. With such a configuration, the number of nano-scale-LED elements included in the electrode assembly per unit area may be significantly increased when compared to that of a typical electrode assembly so that outstanding light intensity may be obtained.

Next, a nano-scale-LED element included in an electrode assembly according to the present disclosure will be described in more detail.

A nano-scale-LED element that may be used in the present disclosure may employ any nano-scale-LED element generally used in lighting or a display without limitation. Preferably, a length of the nano-scale-LED element may be in a range of 100 nm to 10 μm, and more preferably, in a range of 500 nm to 5 μm. When the length of the nano-scale-LED element is less than 100 nm, it may be difficult to manufacture a high efficiency nano-scale-LED element, whereas when the length of the nano-scale-LED element exceeds 10 μm, light emitting efficiency of the nano-scale-LED element may be degraded. A shape of the nano-scale-LED element may be various shapes such as a cylindrical shape, a rectangular parallelepiped shape, and the like, and preferably, the shape may be a cylindrical shape, but is not limited to the above-described shapes.

In the following description of the nano-scale-LED element, "on," "under," "upward," "downward," "over," and "below" refer to vertically upward and downward directions based on each layer included in the nano-scale-LED element.

The nano-scale-LED element may include a first conductive semiconductor layer, an active layer formed on the first conductive semiconductor layer, and a second conductive semiconductor layer formed on the active layer. FIG. 15 illustrates the active layer 30B formed on the first conductive semiconductor layer 30A, and the second conductive semiconductor layer 30C formed on the active layer 30B.

First, the first conductive semiconductor layer 30A will be described. The first conductive semiconductor layer 30A may include, for example, an n-type semiconductor layer. When the nano-scale-LED element is a blue light emitting element, the n-type semiconductor layer may be configured with a semiconductor material having a composition formula of $In_xAl_yGa_{1-x-y}N$ ($0 \leq x \leq 1$, $0 \leq y \leq 1$, and $0 \leq x+y \leq 1$), for example, one or more materials that may be selected from InAlGaN, GaN, AlGaN, InGaN, AlN, InN, and the like, and a first conductive dopant (for example, Si, Ge, Sn, and the like) may be doped on the n-type semiconductor layer. Preferably, a thickness of the first conductive semiconductor layer 30A may be in a range of 500 nm to 5 μm, but the thickness is not limited thereto. Since light emission of the nano-scale-LED element is not limited to the blue color, when a color of the light emission is varied, a different kind of III-V semiconductor material may be used as the n-type semiconductor layer without limitation.

Next, the active layer 30B formed on the first conductive semiconductor layer 30A will be described. When the nano-scale-LED element is a blue light emitting element, the active layer 30B may be formed on the first conductive semiconductor layer 30A and with a single or multiple quantum well structure. A clad layer (not shown) doped with a conductive dopant may be formed on and/or under the active layer 30B, and may be implemented with an AlGaN layer or an InAlGaN layer. In addition, materials such as AlGaN, AlInGaN, and the like may be used as the active layer 30B. When an electric field is applied to such an active layer 30B, light is generated in the active layer 30B due to electron-hole pairs recombination. Preferably, a thickness of the active layer 30B may be in a range of 10 nm to 200 nm, but the thickness is not limited thereto. The active layer 30B may be formed at various positions according to a kind of nano-scale-LED element. Since light emission of the nano-scale-LED element is not limited to the blue color, when a color of the light emission is varied, a different kind of III-V semiconductor material may be used as the active layer without limitation.

Next, the second conductive semiconductor layer 30C formed on the active layer 30B will be described. When the nano-scale-LED element is a blue light emitting element, the second conductive semiconductor layer 30C may be formed on the active layer 30B and may be implemented with at least one p-type semiconductor layer. The p-type semiconductor layer may be configured with a semiconductor material having a composition formula of $In_xAl_yGa_{1-x-y}N$ ($0 \leq x \leq 1$, $0 \leq y \leq 1$, and $0 \leq x+y \leq 1$), for example, one or more materials that may be selected from InAlGaN, GaN, AlGaN, InGaN, AlN, InN, and the like, and a second conductive dopant (for example, Mg) may be doped on the p-type semiconductor layer. Here, a light emitting structure includes the first conductive semiconductor layer 30A, the active layer 30B, and the second conductive semiconductor layer 30C as minimum components thereof, and the light emitting structure may further include a different phosphor layer, a different active layer, a different semiconductor layer, and/or a different electrode layer on/under each of the first conductive semiconductor layer 30A, the active layer 30B, and the second conductive semiconductor layer 30C. Preferably, a thickness of the second conductive semiconductor layer 30C may be in a range of 50 nm to 500 nm, but the thickness is not limited thereto. Since light emission of the nano-scale-LED element is not limited to the blue color, when a color of the light emission is varied, a different kind of III-V semiconductor material may be used as the p-type semiconductor layer without limitation.

In accordance with one preferred embodiment of the present disclosure, the nano-scale-LED element may further include a first electrode layer formed under the first conductive semiconductor layer and a second electrode layer formed over the second conductive semiconductor layer. FIG. 15 illustrates a first electrode layer 30D formed under the first conductive semiconductor layer 30A, and a second electrode layer 30E formed over the second conductive semiconductor layer 30C.

When the first electrode layer 30D and/or the second electrode layer 30E are formed under or over the first or second conductive semiconductor layer, there is an advantage in that a metal ohmic layer may be formed at a temperature that is lower than that required to form the metal ohmic layer at a connection portion between a semiconductor layer and an electrode line of the nano-scale-LED element.

The first electrode layer 30D and the second electrode layer 30E may be each configured using a metal or a metal oxide which is generally used as an electrode of an LED element, and preferably, using chrome (Cr), titanium (Ti), aluminum (Al), gold (Au), nickel (Ni), indium tin oxide (ITO), and an oxide thereof or alloy thereof alone or in combination, but the first electrode layer 30D and the second electrode layer 30E are not limited thereto. Preferably, a thickness of each of the first electrode layer 30D and/or the second electrode layer 30E may be in a range of 1 nm to 100 nm, but the thickness is not limited thereto. Also, the thicknesses and materials of the first electrode layer 30D and/or the second electrode layer 30E may be different from each other or the same as each other.

Meanwhile, a nano-scale-LED element included in one preferred embodiment of the present disclosure may include the insulating film 30F provided at an outer surface of the nano-scale-LED element and configured to entirely cover at least an outer surface of an active layer to prevent an electrical short circuit that may occur due to a contact between outer surfaces of nano-scale-LED elements included in a separation space between two different adjacent electrodes. In addition, the insulating film 30F may preferably coat even on one or more outer surfaces of the first conductive semiconductor layer 30A and the second conductive semiconductor layer 30C to simultaneously prevent an electrical short circuit and a degradation of durability of the nano-scale-LED element due to damage to the outer surfaces of the semiconductor layers. The insulating film 30F may preferably include one or more among silicon nitride ($Si_3N_4$), silicon dioxide ($SiO_2$), aluminum oxide ($Al_2O_3$), hafnium oxide ($HfO_2$), yttrium oxide ($Y_2O_3$), and titanium dioxide ($TiO_2$), and more preferably, a transparent material made of the above described ingredients, but the insulating film 30F is not limited thereto. A transparent insulating film may serve as the above described insulating film 30F, and, at the same time, may minimize a decrease of light emitting efficiency which occurs due to a coating of the insulating film 30F.

Meanwhile, the insulating film 30F of the nano-scale-LED element included in one preferred embodiment of the present disclosure may not be coated on one or more of the first electrode layer 30D and the second electrode layer 30E of the nano-scale-LED element, and more preferably, the insulating film 30F may not be coated on both the electrode layers 30D and 30E. Although an electrical connection should be established between the two electrode layers 30D and 30E and adjacent different electrodes of an electrode line, when the insulating film 30F is coated on both the two electrode layers 30D and 30E, the insulating film 30F may interfere with the electrical connection so that light emission of the nano-scale-LED element may be decreased or the electrical connection may not be established such that there is a problem in that the light emission of the nano-scale-LED element may not occur. However, when an electrical connection is established between the two electrode layers 30D and 30E of the nano-scale-LED element and the adjacent different electrodes, there may be no difficulty in light emission of the nano-scale-LED element and the insulating film 30F may be coated on outer surfaces of the two electrode layers 30D and 30E except for end portions of the two electrode layers 30D and 30E of the nano-scale-LED element.

Also, a nano-scale-LED element included in one preferred embodiment of the present disclosure may further include a hydrophobic film 30G over the insulating film 30F. The hydrophobic film 30G is provided to enable a surface of the nano-scale-LED element to have a hydrophobic characteristic so that an aggregation phenomenon between the nano-scale-LED elements is prevented. When the nano-scale-LED element is mixed in a solvent during the manufacturing process of the electrode assembly, the hydrophobic film 30G may eliminate a problem of a characteristic degradation of an independent nano-scale-LED element by minimizing aggregation between the nano-scale-LED elements, and may enable position alignment to be performed on individual nano-scale-LED elements in a separation space between two adjacent different electrodes.

The hydrophobic film 30G may be formed on the insulating film 30F. In this case, a usable hydrophobic film may employ any material that may be formed on an insulating film to prevent an aggregation phenomenon between nano-scale-LED elements without limitation, and may preferably be configured using a self-assembled monolayer (SAM) such as octadecyltrichlorosilane (OTS), fluoroalkyltrichlorosilane, perfluoroalkyltriethoxysilane, and the like, and a fluoropolymer such as Teflon, Cytop, and the like alone or in combination, but the hydrophobic film 30G is not limited thereto.

The above described electrode assembly according to one preferred embodiment of the present disclosure may be manufactured by the manufacturing process which will be described below. However, the manufacturing of the electrode assembly is not limited to the manufacturing process which will be described below.

An electrode assembly according to one preferred embodiment of the present disclosure may be manufactured by a manufacturing process which includes Operation (1) of forming a first electrode on a base substrate, forming a second electrode on the base substrate to be spaced apart from the first electrode, and disposing a first lateral surface of the first electrode to face a second lateral surface of the second electrode, Operation (2) of introducing a plurality of nano-scale-LED elements and a solvent to a separation space between the first electrode and the second electrode, and Operation (3) of applying electrical power to the first electrode and the second electrode to self-align the plurality of nano-scale-LED elements so that one end of each of the plurality of nano-scale-LED elements may come into contact with the first lateral surface of the first electrode and the other end thereof may come into contact with the second lateral surface of the second electrode.

Figure 16:
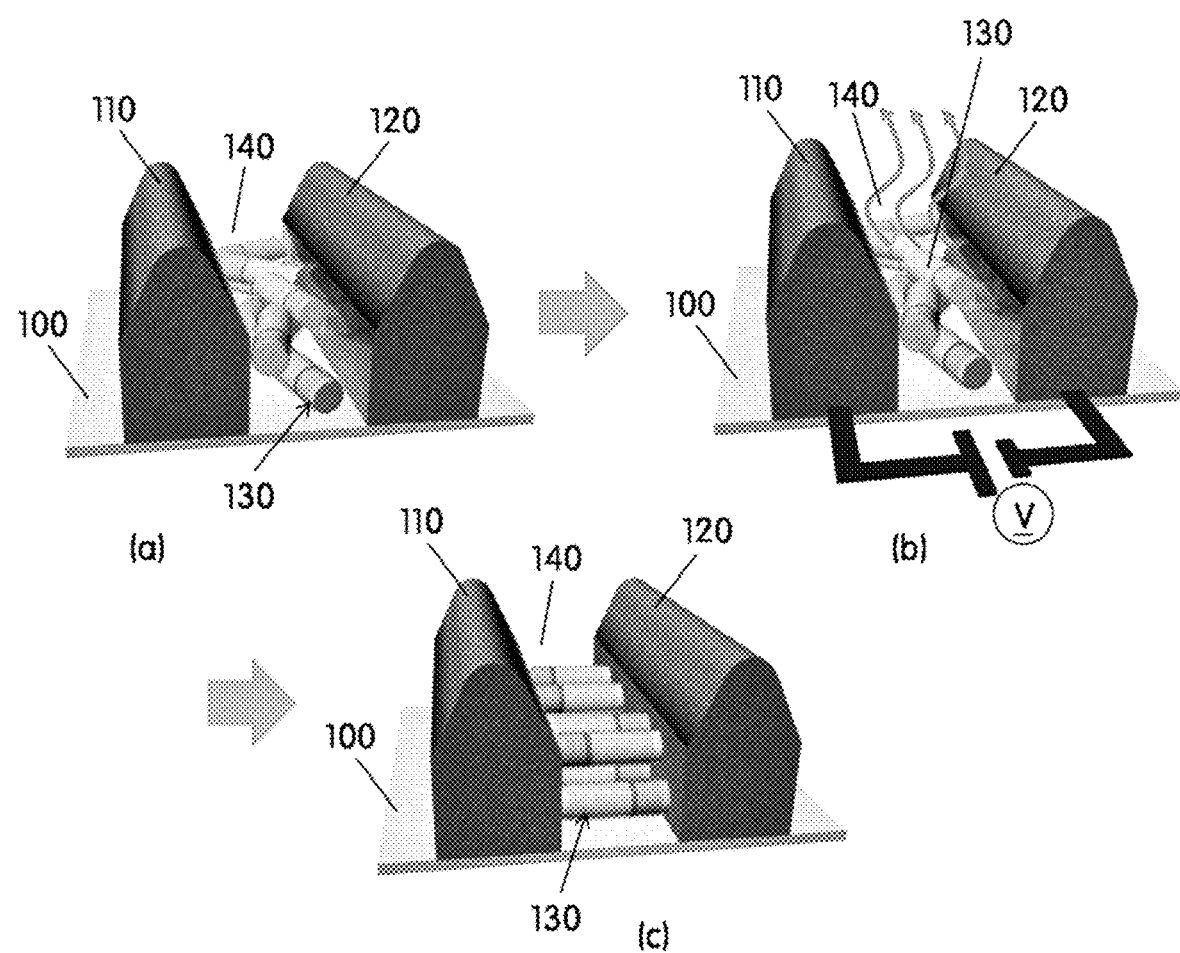
FIG. 16 is a schematic view illustrating a manufacturing process according to one preferred embodiment of the present disclosure.

FIG. 16 is a schematic view illustrating a manufacturing process according to one preferred embodiment of the present disclosure. FIG. 16A illustrates a first electrode 110 formed on a base substrate 100, a second electrode 120 formed on the base substrate 100 and disposed to face a first lateral surface of the first electrode 110, and a nano-scale-LED element 130 and a solvent 140 introduced to a separation space between the first electrode 110 and the second electrode 120. Subsequently, as shown in FIG. 16B, when electrical power is applied to the first electrode 110 and the second electrode 120, the nano-scale-LED element 130 is rotated and a position of the nano-scale-LED element 130 is changed so that, as shown in FIG. 16C, one end of the nano-scale-LED element 130 comes into contact with the first lateral surface of the first electrode 110 and the other end thereof comes into contact with a second lateral surface of the second electrode 120, and a plurality of nano-scale-LED elements 30a, 30b, and 30c form a multilayer and are disposed between the first electrode 110 and the second electrode 120.

First, in Operation (1) according to one preferred embodiment of the present disclosure, the first electrode is formed on the base substrate, the second electrode is formed on the base substrate to be spaced apart from the first electrode, and the first lateral surface of the first electrode is disposed to face the second lateral surface of the second electrode.

A description of the base substrate, the first electrode and the second electrode, and a detailed disposition of the first electrode and the second electrode is the same as the descriptions above, and thus it will be omitted, and a method for manufacturing electrode lines on the base substrate will be described below. However, the method for manufacturing electrode lines is not limited to the method which will be described below.

Figure 17:
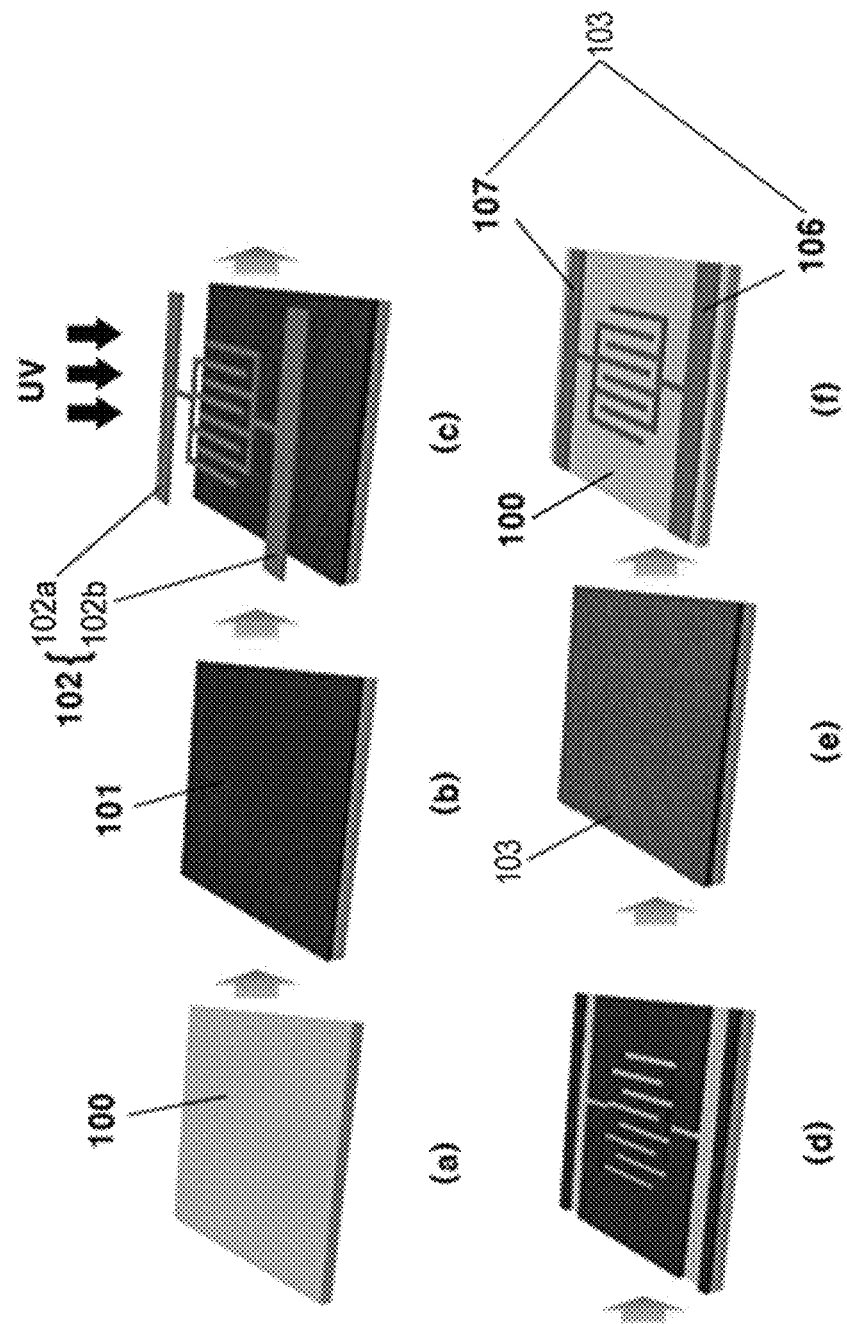
FIG. 17 is a perspective view illustrating a manufacturing process of electrode lines formed on a base substrate according to one preferred embodiment of the present disclosure.

FIG. 17 is a perspective view illustrating a manufacturing process of electrode lines formed on a base substrate according to one preferred embodiment of the present disclosure, and FIG. 17A illustrates a base substrate 100 at which electrode lines are formed. Next, as shown in FIG. 17B, a photo resist (PR) 101 may be coated on the base substrate 100. The PR may be a PR that is generally used in the related art. A method for coating the PR on the base substrate 100 may be one among spin coating, spray coating, and screen printing, and preferably, may be spin coating, but it is not limited thereto, and a detailed method may employ a known method in the related art. A thickness of the PR 101 that is coated may be in a range of 0.1 μm to 10 μm. However, the thickness of the PR 101 that is coated may vary according to a thickness of an electrode that will be deposited on the base substrate.

After the PR 101 is formed on the base substrate 100 as described above, a mask 102 on which patterns 102a and 102b, which correspond to electrode lines with which the first electrode and the second electrode are to be alternately disposed and spaced apart from each other on the same plane (See, FIG. 4), are drawn may be placed on the PR 101 as shown in FIG. 17C, and then ultraviolet light may be irradiated toward the mask 102.

Thereafter, portions of the PR that are not exposed to the ultraviolet light may be removed by being dipped in a conventional PR solvent, and an exposed portion of the PR at which electrode lines are formed as shown in FIG. 17D may be removed through such an operation. A width of the pattern 102a corresponding to the first electrode of the electrode lines may be in a range of 100 nm to 50 μm, and a width of the pattern 102b corresponding to the second electrode thereof may be in a range of 100 nm to 50 μm, but the widths are not limited to the described above.

Afterward, as shown in FIG. 17E, an electrode forming material 103 may be deposited at a portion at which the PR is removed in the form of the electrode lines drawn on the mask 102. The electrode forming material may be a material of the above described electrode, and a description thereof will be omitted. Materials forming the first electrode and the second electrode may be different from each other or the same as each other. The deposition of the electrode forming material may be performed by one among thermal deposition, e-beam deposition, sputtering deposition, and screen printing, and preferably, may be thermal deposition, but the deposition is not limited thereto.

After the electrode forming material 103 is deposited as shown in FIG. 17F, the PR 101 coated on the base substrate 100 may be removed using one PR remover among acetone, N-methylpyrrolidone (1-methyl-2-pyrrolidone (NMP)), and dimethyl sulfoxide (DMSO) so that electrode lines 103a (10 in FIG. 3) and 103b (20 in FIG. 3) deposited on the base substrate 100 may be manufactured.

In the electrode lines including the first electrode and the second electrode which are manufactured through the above described method according to one preferred embodiment of the present disclosure, a unit electrode area, that is, an area of a region at which the nano-scale-LED elements and two electrodes capable of independently driving the nano-scale-LED elements are disposed, may preferably be in a range of 1 μm$^2$ to 100 cm$^2$, and more preferably, may be in a range of 10 μm$^2$ to 100 mm$^2$, but the unit electrode area is not limited to the above described area. Also, a single unit electrode or a plurality of unit electrodes may be included in the electrode lines.

Next, in Operation (2) according to one preferred embodiment of the present disclosure, the plurality of nano-scale-LED elements and the solvent are introduced to the separation space between the first electrode and the second electrode.

Operation (2) according to one preferred embodiment of the present disclosure is an operation of introducing the plurality of nano-scale-LED elements and the solvent to the separation space between the first electrode and the second electrode of the electrode lines which are manufactured as described above. The plurality of nano-scale-LED elements and the solvent may be introduced to the electrode lines in a solution state in which the plurality of nano-scale-LED elements are mixed in the solvent before being introduced to the electrode lines, or the plurality of nano-scale-LED elements may be introduced between two different adjacent electrodes and then the solvent may be introduced to the electrode lines. When the plurality of nano-scale-LED elements and the solvent are introduced in the solution state, a solution may be in an ink phase or a paste phase.

A detailed description regarding the nano-scale-LED element is the same as the description above, and thus it will be omitted.

The solvent may preferably be a solvent selected from a group consisting of acetone, water, alcohol, and toluene, and more preferably, may be acetone. However, a kind of solvent is not limited to the described above, and any solvent which is easily evaporated without physically or chemically affecting the nano-scale-LED element may be used without limitation.

Preferably, 0.001 to 100 parts by weight of the nano-scale-LED element may be introduced on the basis of 100 parts by weight of the solvent. When less than 0.001 parts by weight of the nano-scale-LED element is introduced, the number of nano-scale-LED elements connected to the two electrodes may be reduced so that it may be difficult for the electrode assembly including the nano-scale-LED elements to normally function, and there may be a problem in that the solution should be added several times to address such a difficulty. When more than 100 parts by weight of the nano-scale-LED element is introduced, there may be a problem in that an alignment of each of the nano-scale-LED elements may be interfered with.

In the present disclosure, the method for introducing the nano-scale-LED elements and the solvent to the separation space between the first electrode and the second electrode is not specifically limited. As a non-limiting example, when the nano-scale-LED elements and the solvent are introduced in the solution state, the solution may be dropped over the first electrode and the second electrode to flow into the separation space between the first electrode and the second electrode adjacent thereto. To facilitate an insertion of a nano-scale-LED element into the separation space between two different adjacent electrodes to be connected to the two different adjacent electrodes, the nano-scale-LED element may preferably be pre-located in the separation space before Operation (2), which will be described below, is performed.

To this end, in accordance with one preferred embodiment of the present disclosure, the first electrode and the second electrode may include a portion in which a width of each of the first and second electrodes narrows toward the upward direction that is perpendicular to the base substrate. With such a configuration, a solution introduced from the electrode lines may flow into the separation space between the first and second electrodes without remaining on an upper surface of each of the first and second electrodes.

Figure 18:
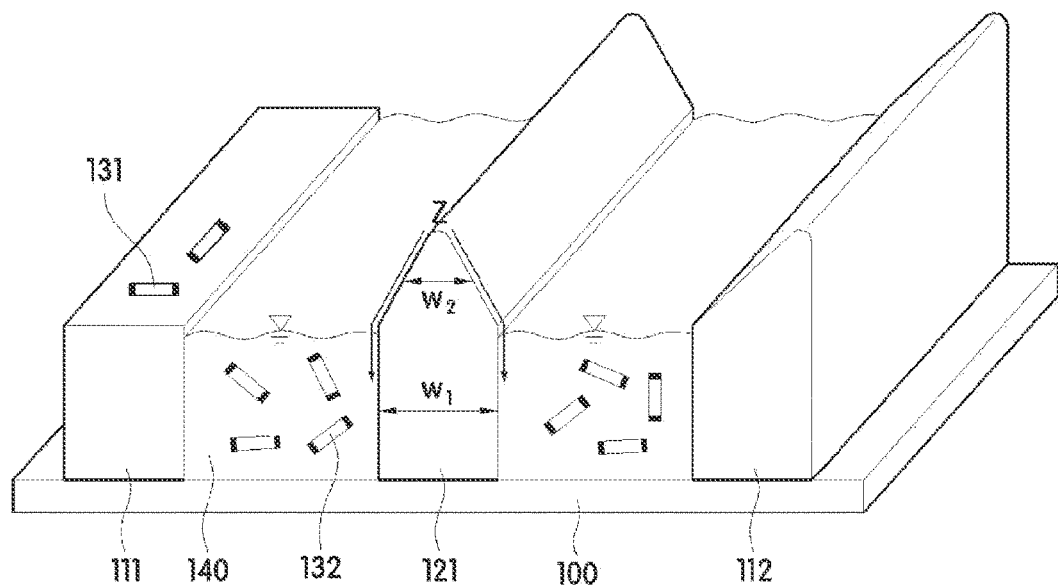
FIG. 18 is a schematic view of Operation (2) according to one preferred embodiment of the present disclosure.

FIG. 18 is a schematic view of Operation (2) according to one preferred embodiment of the present disclosure, and illustrates first electrodes 111 and 112 formed on a base substrate 100, a second electrode 121 formed to have lateral surfaces disposed to face the first electrodes 111 and 112, a plurality of nano-scale-LED elements 131 and 132, and a solvent 140. In the case in which an upper surface of each of the electrodes is parallel to the base substrate, when the nano-scale-LED elements or a solution including the nano-scale-LED elements falls onto the electrodes, some of the nano-scale-LED elements 131 may be located at the upper surface of the first electrode 111. On the other hand, a cross section of an electrode includes a portion in which a width thereof narrows toward the upward direction that is perpendicular to the base substrate, and, for example, the electrodes 121 and 112 each having an electrode width $w_2$ of an upper end part that is narrower than an electrode width $w_1$ of a lower end part may have an advantage in that, when the nano-scale-LED elements or the solution including the nano-scale-LED elements falls onto the electrodes, the nano-scale-LED elements may flow down along inclined surfaces of the electrode as in Route Z in FIG. 18 and may be located in a separation space between the electrodes, which is a destination of the nano-scale-LED elements.

Next, in Operation (3) according to one preferred embodiment of the present disclosure, electrical power is applied to the first electrode and the second electrode to self-align the plurality of nano-scale-LED elements so that one end of each of the plurality of nano-scale-LED elements may come into contact with a first lateral surface of the first electrode and the other end thereof may come into contact with a second lateral surface of the second electrode.

Charges are induced in the nano-scale-LED elements by an induction of an electric field that is formed by a potential difference between the two electrodes, and both ends of each of the nano-scale-LED elements have different charges in a length direction centering on the center of each of the nano-scale-LED elements. Therefore, the one end of each of the nano-scale-LED elements, which is charged with a positive charge, comes into contact with a lateral surface of the second electrode which has a charge opposite thereto, and the other end thereof, which is charged with a negative charge, comes into contact with a lateral surface of the other electrode which has a charge opposite thereto so that the nano-scale-LED elements may be self-aligned to be interposed in the separation space. In the case in which LED elements each have a size that may be visually recognized and may be picked up using an instrument, the LED elements may be directly physically disposed and inserted into a separation space between different electrodes that are formed to be spaced apart from each other on the same plane to be connected to the different electrodes. However, it may be difficult to directly physically dispose the nano-scale-LED elements of the present disclosure so that there is a problem in that the nano-scale-LED elements may not be simultaneously inserted into a separation space between different nano-scale electrodes that are spaced apart from each other on the same plane to be connected to the different nano-scale electrodes. Accordingly, the present disclosure may address the above described problem by applying electrical power to the electrode lines to enable the nano-scale-LED elements themselves to be simultaneously inserted into the separation space between two different electrodes and to be connected to the two different electrodes.

The electrical power may preferably be an alternating current, and more preferably, a voltage of the electrical power may be in a range of 40 to 100 Vpp and the electrical power may be applied for 10 to 120 seconds. When the voltage is less than 20 volts (V) and/or the electrical power is applied for less than for 10 seconds, an electric filed is not sufficiently formed to self-align nano-scale-LED elements so that the nano-scale-LED elements may not be aligned to positions in a separation space between electrodes as intended. When the voltage exceeds 50 V and/or the electrical power is applied for more than 120 seconds, excessive electrical power is applied to the nano-scale-LED elements and/or the electrodes so that the nano-scale-LED elements and/or the electrodes are damaged and thus there may be a problem in that light emitting efficiency is degraded or light emission does not occur.

Meanwhile, in Operation (2) according to one preferred embodiment, even when electrical power is applied to the electrode lines according to an aspect ratio of each nano-scale-LED element, it may be difficult to self-align the nano-scale-LED elements. Therefore, in accordance with one preferred embodiment of the present disclosure, the aspect ratio of each the nano-scale-LED elements included in the present disclosure may be in a range of 1.2 to 100, and preferably, may be in a range of 1.2 to 50, and more preferably, may be in a range of 1.5 to 20, and particularly preferably, may be in a range of 1.5 to 10. When the aspect ratio of each the nano-scale-LED elements is less than 1.2, there is a problem in that the nano-scale-LED elements may not be self-aligned even though electrical power is applied to the electrode lines. When the aspect ratio exceeds 100, a voltage of electrical power required to self-align the nano-scale-LED elements may be lowered, but it may be difficult to manufacture the nano-scale-LED elements each exceeding the aspect ratio of 100 due to a limitation in a process of manufacturing a nano-scale-LED element using dry etching and the like.

Figure 19:
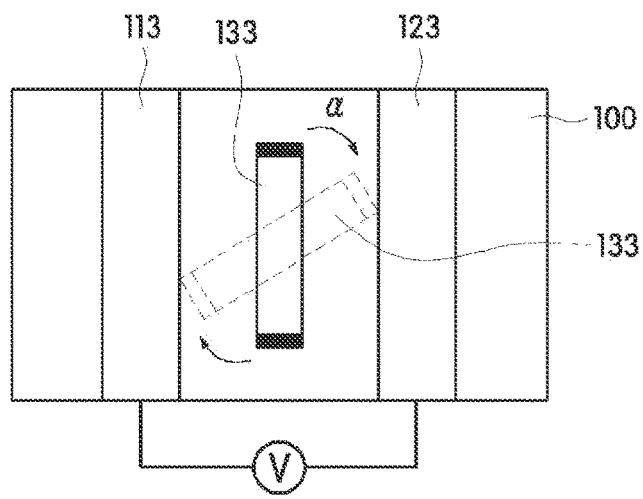
FIG. 19 is a plan view illustrating a self-alignment of a nano-scale-LED element according to one preferred embodiment of the present disclosure.
Figure 20:
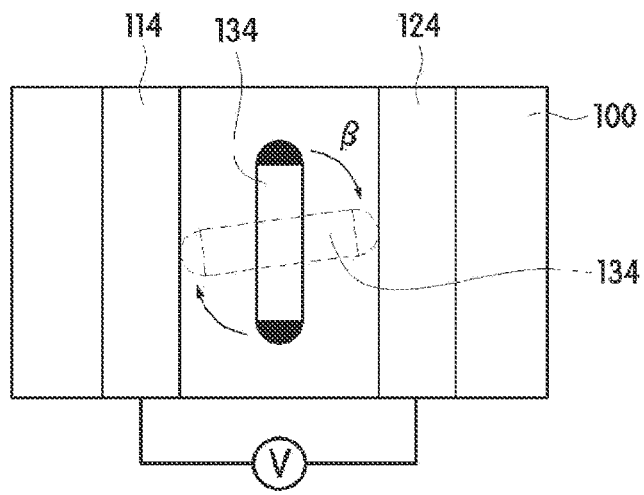
FIG. 20 is a plan view illustrating a self-alignment of a nano-scale-LED element according to one preferred embodiment of the present disclosure

Also, in accordance with one preferred embodiment of the present disclosure, both ends of a nano-scale-LED element may each include a convex curved surface to facilitate a self-alignment of the nano-scale-LED element and to reduce a volume occupied by a single nano-scale-LED element in a separation space so that many nano-scale-LED elements may be included in the separated space. FIG. 19 is a plan view illustrating a self-alignment of a nano-scale-LED element according to one preferred embodiment of the present disclosure. When electrical power is applied to a first electrode 113 and a second electrode 123 which are formed on a base substrate 100 and are spaced apart from each other, both ends of a nano-scale-LED element 133 are rotated by a in different electrode directions. As shown in FIG. 19, in the case in which both of the ends of the nano-scale-LED element 133 do not include a curved surface, a self-aligned nano-scale-LED element 133' may be inserted between the two different electrodes 113 and 123 to be connected to the two different electrodes 113 and 123, but there is a problem in that the self-aligned nano-scale-LED element 133' may not be connected perpendicular to lateral surfaces of the two different electrodes 113 and 123 in a length direction of the self-aligned nano-scale-LED element 133'. FIG. 20 is a plan view illustrating a self-alignment of a nano-scale-LED element according to one preferred embodiment of the present disclosure. When electrical power is applied to a first electrode 114 and a second electrode 124 which are formed on a base substrate 100 and are spaced apart from each other, both ends of a nano-scale-LED element 134 are rotated by β in different electrode directions. At this point, in the case in which both of the ends of the nano-scale-LED element 134 include a curved surface as shown in FIG. 20, there is an advantage in that the nano-scale-LED element 134 may be more easily positionally aligned to be perpendicular to lateral surfaces of two different electrodes in a length direction of the nano-scale-LED element 134 when compared to the nano-scale LED element 133 in FIG. 19.

Although the technical spirit of the present disclosure has been specifically described according to the above-described preferred embodiments, it should be noted that the above described embodiments are intended only for describing the present disclosure and not to limit thereto. In addition, it should be understood that various embodiments can be devised by those skilled in the art within the scope and the technical spirit of the present disclosure.

What is claimed is:

1. A display device comprising:
    a substrate;
    a lower electrode on the substrate;
    a first layer on the lower electrode and the substrate;
    a plurality of light emitting elements on the first layer and spaced from each other;
    a plurality of first electrodes on the first layer, the first electrodes extending in a first direction and spaced from each other; and
    a second electrode on the first layer and spaced from the first electrodes,
    wherein the second electrode comprises a first portion extending in the first direction between the first electrodes, a second portion extending in the first direction and space from the first portion with at least one of the first electrodes therebetween, and a third portion extending in a second direction and connecting the first portion and the second portion, and
    a first end portion of at least one of the light emitting elements contacts the first electrode, and
    a second end portion of the at least one of the light emitting elements contacts the first portion or the second portion of the second electrode.

2. The display device of claim 1, wherein at least one of the light emitting elements comprises:
    a first semiconductor layer;
    an active layer on the first semiconductor layer;
    a second semiconductor layer on the active layer; and
    a first insulating film covering at least an outer surface of the active layer from among outer surfaces of the light emitting elements.

3. The display device of claim 2, wherein the plurality of light emitting elements comprises:
    a third light emitting element of which the first end portion comprises an end portion of the first semiconductor layer, and
    a fourth light emitting element of which the second end portion comprises an end portion of the first semiconductor layer.

4. The display device of claim 3, wherein at least one of the light emitting elements further comprises an electrode layer on the second semiconductor layer,
    wherein the electrode layer of the third light emitting element contacts the second electrode, and
    the electrode layer of the fourth light emitting element contacts at least one of the first electrodes.

5. The display device of claim 2, wherein the plurality of light emitting elements comprises:
    a first light emitting element located between one of the first electrodes and the first portion of the second electrode, and
    a second light emitting element located between another of the first electrodes and the second portion of the second electrode.

6. The display device of claim 2, wherein at least one of the light emitting elements further comprises a second insulating film covering the first insulating film.

7. The display device of claim 1, wherein at least one of the first electrodes electrically contacts the lower electrode through a contact hole formed at the first layer.

8. The display device of claim 7, wherein the contact hole is located at a first area that is an outer region of a second region where the plurality of light emitting elements is located.

9. The display device of claim 7, wherein the lower electrode extends in the second direction.

10. The display device of claim 1, wherein the second electrode further comprises:
    a fourth portion extending in the first direction between the first electrodes,
    a fifth portion extending in the first direction and spaced from one of the first electrodes in the first direction, and
    a sixth portion extending in the second direction and connecting the fourth portion and the fifth portion.

11. A display device comprising:
    a substrate;

a lower electrode on the substrate;

a first layer on the lower electrode and the substrate;

a plurality of light emitting elements on the first layer and spaced from each other;

a first electrode on the first layer; and a second electrode on the first layer and spaced from the first electrode, wherein a first end portion of at least one of the light emitting elements contacts the first electrode, and a second end portion of at least one of the light emitting elements contacts the second electrode, and a distance between at least one of the light emitting elements and the first layer is smaller than a distance between an upper surface of the first and second electrodes and the first layer.

12. The display device of claim 11, wherein at least one of the light emitting elements comprises:

a first semiconductor layer;

an active layer on the first semiconductor layer;

a second semiconductor layer on the active layer;

an electrode layer on the second semiconductor layer; and a first insulating film covering at least an outer surface of the active layer from among outer surfaces of the light emitting elements.

13. The display device of claim 12, wherein at least one of the light emitting elements further comprises a second insulating film covering the first insulating film.

14. The display device of claim 11, wherein the first electrode and the second electrode comprise a first surface that is a contact surface between the first electrode or the second electrode and the first layer and a second surface that is a contact surface with at least one of the light emitting elements, and wherein the first surface is not parallel with the second surface.

15. The display device of claim 11, wherein the plurality of light emitting elements comprises a first light emitting element and a second light emitting element, and a first distance between a farthest point and a closest point of the first light emitting element from a base substrate is different from a second distance between a farthest point and a closest point of the second light emitting element from the base substrate.

* * * * *